United States Patent
Goshonoo

(10) Patent No.: US 12,300,770 B2
(45) Date of Patent: May 13, 2025

(54) FLIP-CHIP MOUNTED MONOLITHIC MICRO LED DISPLAY ELEMENT INCLUDING A PLURALITY OF LIGHT-EMITTING PARTS ARRANGED IN A MATRIX

(71) Applicant: TOYODA GOSEI CO., LTD., Kiyosu (JP)

(72) Inventor: Koichi Goshonoo, Kiyosu (JP)

(73) Assignee: Toyoda Gosei Co., Ltd., Kiyosu (JP)

( * ) Notice: Subject to any disclaimer, the term of this patent is extended or adjusted under 35 U.S.C. 154(b) by 549 days.

(21) Appl. No.: 17/682,473

(22) Filed: Feb. 28, 2022

(65) Prior Publication Data
US 2022/0285593 A1    Sep. 8, 2022

(30) Foreign Application Priority Data

Mar. 3, 2021   (JP) .................................. 2021-033238
Mar. 11, 2021  (JP) .................................. 2021-039758

(51) Int. Cl.
  *H01L 33/58*    (2010.01)
  *H01L 33/38*    (2010.01)

(52) U.S. Cl.
  CPC ............ *H01L 33/58* (2013.01); *H01L 33/387* (2013.01)

(58) Field of Classification Search
  CPC ..... H01L 33/387; H01L 33/58; H01L 33/145; H01L 27/156
  See application file for complete search history.

(56) References Cited

U.S. PATENT DOCUMENTS

| | | |
|---|---|---|
| 6,076,932 A | 6/2000 | Uchida et al. |
| 7,323,723 B2 | 1/2008 | Ohtsuka et al. |
| 10,748,881 B2 | 8/2020 | Kim et al. |
| 11,289,461 B2 | 3/2022 | Kim et al. |
| 11,804,511 B2 | 10/2023 | Kim et al. |
| 2002/0139987 A1 | 10/2002 | Collins, III et al. |

(Continued)

FOREIGN PATENT DOCUMENTS

| | | |
|---|---|---|
| JP | H10-153704 A | 6/1998 |
| JP | 2002-359402 A | 12/2002 |

(Continued)

OTHER PUBLICATIONS

Japanese Office Action, dated Dec. 12, 2023 in Japanese Application No. 2021-033238 and English Translation thereof.

(Continued)

*Primary Examiner* — Changhyun Yi
(74) *Attorney, Agent, or Firm* — MCGINN I.P. LAW GROUP, PLLC

(57) ABSTRACT

The present invention provides a flip-chip mounted monolithic micro LED having improved contrast. The light-emitting device includes a substrate, an n-type layer, a light-emitting layer, a p-type layer, a transparent electrode, a p-electrode, an n-electrode, a protective film, an absorbing structure, and a side wall insulating film. The absorbing structure is a layered body in which a dielectric film and a metal film are alternately deposited, and the top layer is a dielectric film. Reflected light of light emitted from the light-emitting layer or reflected light of light from the outside, or transmitted light from the backside of the substrate can be absorbed by the absorbing structure, thereby improving contrast.

19 Claims, 14 Drawing Sheets

(56) References Cited

U.S. PATENT DOCUMENTS

| | | | |
|---|---|---|---|
| 2006/0175621 A1 | 8/2006 | Ohtsuka et al. | |
| 2008/0272712 A1 | 11/2008 | Jalink et al. | |
| 2011/0309378 A1* | 12/2011 | Lau ................... | H01L 27/1214 |
| | | | 438/26 |
| 2019/0164944 A1* | 5/2019 | Chae .................. | H01L 25/0756 |
| 2019/0214373 A1 | 7/2019 | Kim et al. | |
| 2020/0176655 A1 | 6/2020 | Iguchi et al. | |
| 2020/0185363 A1 | 6/2020 | Kim et al. | |
| 2022/0139891 A1 | 5/2022 | Kim et al. | |
| 2022/0139997 A1 | 5/2022 | Suga et al. | |
| 2023/0128703 A1 | 4/2023 | Kim et al. | |
| 2023/0343810 A1 | 10/2023 | Kim et al. | |

FOREIGN PATENT DOCUMENTS

| | | |
|---|---|---|
| JP | 2020-088383 A | 6/2020 |
| JP | 2020-119967 A | 8/2020 |
| JP | 2021-022688 A | 2/2021 |
| JP | 2021-506107 A | 2/2021 |
| WO | 2003/058726 A1 | 7/2003 |
| WO | WO 2007/034367 A1 | 3/2007 |
| WO | WO 2020/153339 A1 | 7/2020 |

OTHER PUBLICATIONS

Japanese Office Action, dated Dec. 5, 2023 in Japanese Application No. 2021-039758 and English Translation thereof.

* cited by examiner

FLIP-CHIP MOUNTED MONOLITHIC MICRO LED DISPLAY ELEMENT INCLUDING A PLURALITY OF LIGHT-EMITTING PARTS ARRANGED IN A MATRIX

BACKGROUND OF THE INVENTION

Field of the Invention

The present invention relates to a semiconductor light-emitting device, particularly to a flip-chip mounted monolithic micro LED display element.

Background Art

Recently, the demand for high-resolution display is increasing, and a micro-LED display is attracting attention (Patent Document 1). The micro-LED display is a display in which micro-LEDs having the order of 1 μm to 100 μm are arranged in a matrix. As the micro LED display, a structure in which micro-LEDs are individual chips and a monolithic structure in which a plurality of micro LEDs is formed on one substrate, are well known (Patent Document 1). The monolithic micro-LED display is superior in micronization.

When a single common substrate is used, a semiconductor layer including a light-emitting layer is generally formed on a substrate. A light-emitting device having a plurality of light-emitting parts emitting a different color light on the same substrate, has been researched and developed.

Patent Document 1 discloses a micro LED having a structure in which an n-type layer, a light-emitting layer, and a p-type layer are sequentially deposited. In the micro LED, the micro light emitting elements are separated for each pixel by forming a trench with a depth reaching the n-type layer. The side surface of the separation trench is tilted, covered by an insulating film, and the insulating film is covered by a metal film. Thereby, cross talk is prevented among pixels, and reduction of contrast is prevented.

Patent Document 2 discloses a monolithic light-emitting device having a first semiconductor film 12 (first light-emitting layer), a second semiconductor film 14 (second light-emitting layer), and a third semiconductor film 16 (third light-emitting layer), each of which emits a different color light on a substrate (paragraphs [0022] to [0024]). In the third light-emitting part P3, three types of light-emitting layers are deposited (paragraph [0016] and FIG. 1). In this case, a light-emitting layer having a well layer with the smallest bandgap of three types of light-emitting layers, emits light intensively (paragraphs [0035] to [0038] and FIG. 2).

Patent Document 1: Japanese Patent Application Laid-Open (kokai) No. 2020-88383
Patent Document 2: Japanese Patent Application Laid-Open (kokai) No. 2020-119967

However, in the conventional monolithic micro LED, light emitted from the light-emitting layer or light from the outside is reflected on an interface such as a transparent electrode, an insulating film, and a junction electrode of the common n-electrode. Moreover, light from the light-emitting layer of one pixel may transmits through the transparent electrodes of other pixels. Therefore, there was a problem that contrast was reduced between pixels. For example, the pixel that does not emit light appeared to emit light due to reflection or transmission of light, or light did not become dark enough.

In the techniques of Patent Document 2, a semiconductor region corresponding to sub pixel is separated on a plane by etching and others, (paragraph [0052] and FIG. 4(b)). To perform separation, for example, a separating space extending in a deposition direction is required between the third light-emitting part P3 and the second light-emitting part P2. The element is difficult to be miniaturized due to this space. Also, etching for separation requires time. If a p-type contact layer is commonly formed among the light-emitting parts, a current is diffused, the light-emitting layers of the adjacent sub pixels emit light. In this case, the contrast of this light-emitting device is reduced.

SUMMARY OF THE INVENTION

In view of the foregoing, an object of the present invention is to achieve a monolithic micro LED having improved contrast. Another object of the present invention is to achieve a method for producing a light-emitting device suitable for miniaturization and with high contrast.

In a first aspect of the present invention, there is provided a flip-chip mounted monolithic micro LED display element in which a plurality of light-emitting parts is arranged in a matrix. The micro LED display element includes a substrate, an n-type layer disposed on or above the substrate, a light-emitting layer disposed on or above the n-type layer, a p-type layer disposed on or above the light-emitting layer, a plurality of first electrodes formed for each light-emitting part on or above the p-type layer, and an absorbing structure absorbing light disposed on or above the first electrode. The absorbing structure has a structure in which a dielectric film and a metal film are alternately deposited, and the top layer is a dielectric film.

In the first aspect of the present invention, a through hole is formed in a region at the upper portion of the first electrode of the absorbing structure. A second electrode may be formed in contact with the first electrode via the through hole at the upper portion of the absorbing structure, and a side wall insulating film may be formed on the side wall of the absorbing structure exposed by the through hole. The dielectric film may be made of at least one selected from a group consisting of $TiO_2$ and $Nb_2O_5$. The top layer of the dielectric film is made of $SiO_2$, and other layers of the dielectric film may be made of at least one selected from a group consisting of $TiO_2$ and $Nb_2O_5$. Furthermore, an insulating film made of $SiO_2$ may be formed on the absorbing structure.

The metal film may be made of at least one selected from a group consisting of W, Mo, V, Ta, Cr, Ti, and Ni. The number of layers of the metal film may be 2 to 5.

The thickness of the dielectric film and the metal film may be set to obtain incident angle dependency of reflectance of the absorbing structure such that the maximum reflectance is not more than 20% in a range where the incident angle is not more than 70° to the light with an emission wavelength of the light-emitting layer. The thickness of the dielectric film and the metal film may be set so that the maximum reflectance is not more than 5% in a range where the incident angle to the light with an emission wavelength of the light-emitting layer is not more than 50°. The thickness of the dielectric film and the metal film may be set so that the maximum reflectance is not more than 10% in a range of wavelength from 400 nm to 700 nm to the light with an incident angle of 0°.

A shielding wall may be formed, which electrically and optically separates the adjacent light-emitting parts, and extends from the bottom of the absorbing structure to the n-type layer.

The light-emitting layer may be formed by depositing sub light-emitting layers emitting light with a different wavelength. In that case, the light-emitting layer may have a step so that the band gap of the sub light-emitting layer becomes smaller in order from the substrate toward the p-type layer, and the sub light-emitting layer does not exist between the sub light-emitting layer emitting light of an emission color of each light-emitting part and the p-type layer.

Furthermore, when the light-emitting layer has a step, a shielding wall may be formed to electrically and optically separate the adjacent light-emitting parts. The shielding wall may extend so as to cover at least the total thickness from the bottom of the absorbing structure to the sub light-emitting layer emitting light of emission color of each light-emitting part. Needless to say, the shielding wall may extend from the bottom of the absorbing structure to the n-type layer.

In a second aspect of the present invention, there is provided a flip-chip mounted monolithic micro LED display element in which a plurality of light-emitting parts is arranged in a matrix. The micro LED display element includes a substrate, an n-type layer disposed on or above the substrate, a light-emitting layer disposed on or above the n-type layer, a p-type layer disposed on or above the light-emitting layer.

The light-emitting layer is formed by depositing sub light-emitting layers emitting light with a different wavelength. The light-emitting layer has a step so that the band gap of the sub light-emitting layer becomes smaller in order from the substrate toward the p-type layer, and the sub light-emitting layer does not exist between the sub light-emitting layer emitting light of an emission color of each light-emitting part and the p-type layer.

A shielding wall extending from the bottom of the absorbing structure to the n-type layer is formed to electrically and optically separate the adjacent light-emitting parts.

In the second aspect of the present invention, an intermediate layer may be formed between the sub light-emitting layers. The band gap of the intermediate layer is preferably larger than the band gap of the sub light-emitting layer of each light-emitting part.

The shielding wall is preferably a modified layer of semiconductor having high electric resistance by ion implantation and having high absorptivity of light emitted from the sub light-emitting layer.

The modified layer is preferably formed either so as to surround the periphery of each light-emitting part or in an entire region other than the light-emitting parts.

Moreover, a transparent electrode may be formed on the p-type semiconductor layer, and the modified layer may be formed in the transparent electrode.

Furthermore, the depth of the shielding wall preferably satisfies the following equation:

$$D1 \geq W1/\tan(\theta c)$$

$$n1 \cdot \sin(\theta c) = n2$$

θc: Critical angle
W1: Pitch of sub pixel
D1: Depth of shielding wall
n1: Refractive index of semiconductor
n2: Refractive index of substrate In the light-emitting device having a shielding wall, current flowing through the sub light-emitting layer emitting light of an emission color of each light-emitting part can be suppressed from flowing to other light-emitting part. Therefore, the light-emitting device can emit light with high contrast. Light from the sub light-emitting layer emitting light of an emission color of each light-emitting part is prevented from being incident on other light-emitting part. Thereby, the interface between the light-emitting regions can be clarified.

In a third aspect of the present invention, there is provided a method for producing a light-emitting device, the method comprising:

forming an n-type semiconductor layer, a first light-emitting layer, a first intermediate layer, and a second light-emitting layer on or above a first surface of a substrate;

forming a recess to expose a part of the first intermediate layer;

forming a p-type semiconductor layer; and implanting ions into the semiconductor layer.

The light-emitting device is a monolithic element having a first light-emitting region and a second light-emitting region.

The emission wavelength of the second light-emitting layer is different from the emission wavelength of the first light-emitting layer.

Ion implantation includes dividing the first light-emitting layer and the second light-emitting layer into sub pixels, and implanting ions into a region surrounding the periphery of the first light-emitting layer and the second light-emitting layer.

According to the present invention, light reflected inside the element or light from the outside can be absorbed by the absorbing structure, thereby improving contrast.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to these embodiments.

First Embodiment

Figure 1:
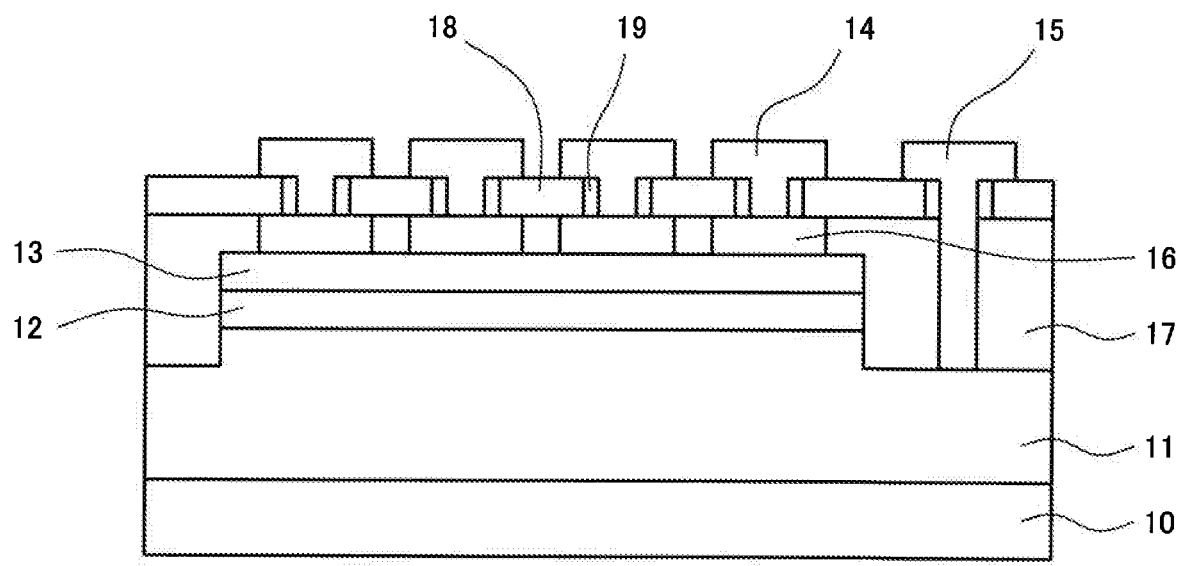
FIG. 1 shows the structure of a light-emitting device according to a first embodiment.

FIG. 1 shows the structure of a light-emitting device according to a first embodiment. The light-emitting device according to the first embodiment is a monolithic micro LED display element made of Group III nitride semiconductor, in which a plurality of light-emitting parts is arranged in a matrix in one element. The light-emitting device according to the first embodiment emits a single color, and one pixel is composed of one sub pixel (light-emitting part). The light-emitting device according to the first embodiment is of a flip-chip type which extracts light from the backside of the substrate, and is mounted face down on a mounting substrate (not illustrated).

As shown in FIG. 1, the light-emitting device according to the first embodiment includes a substrate 10, an n-type layer 11, a light-emitting layer 12, a p-type layer 13, a transparent electrode 16 (corresponding to the first electrode of the present invention), a p-electrode 14 (corresponding to a second electrode of the present invention), an n-electrode 15, a protective film 17, an absorbing structure 18, and a side wall insulating film 19.

The substrate 10 is a growth substrate for growing Group III nitride semiconductor, and is made of, for example, sapphire, GaN, and SiC.

The n-type layer 11 is an n-type semiconductor layer formed on the substrate 10. The light-emitting layer 12 is a semiconductor layer formed on the n-type layer 11, which is a layer having a MQW structure or a SQW structure. For example, the light-emitting layer 12 is a blue light emitting layer formed by alternately depositing an AlGaN barrier layer and an InGaN well layer. The p-type layer 13 is a p-type semiconductor layer formed on the light-emitting layer 12. A trench reaching the n-type layer 11 is formed by etching in the outer periphery of the element of the semiconductor layer. The n-type layer 11 is exposed in the bottom of the trench. The light-emitting device according to the first embodiment can be micronized because the light-emitting layer 12 is not separated for each pixel.

A plurality of the transparent electrodes 16 is arranged in a matrix pattern on the p-type layer 13. The light-emitting layer 12 just below a region where this p-electrode 14 is disposed, emits light and becomes one pixel. In other words, the transparent electrode 16 is disposed for each pixel. The transparent electrode 16 is made of, for example, ITO and IZO.

The protective film 17 is formed so as to cover the p-type layer 13, the side surface of the transparent electrode 16, and the n-type layer 11 exposed in the trench. The protective film 17 is made of, for example, $SiO_2$ and SiN.

The absorbing structure 18 is formed on the protective film 17. However, a through hole is formed in a region corresponding to the top of the transparent electrode 16 or the n-electrode 15 to remove the absorbing structure 18. Moreover, the absorbing structure 18 is formed in a film parallel to a main surface of the substrate 10.

The absorbing structure 18 is formed to absorb light from the light-emitting layer 12 or light from the outside of the element, and suppress the reduction of contrast in the micro LED display. In the conventional structure having no absorbing structure 18, light emitted from the light-emitting layer 12 is reflected inside the element such as the transparent electrode 16, the p-electrode 14, an interface between the substrate 10 and the n-type layer 11, and light was sometimes extracted from the top of the light-emitting part which does not emit light. Similarly, light was sometimes extracted from the top of the light-emitting part which does not emit light because light from the outside of the element is reflected inside the element or transmitted. As a result, the light-emitting part which does not emit light appeared to emit light or light did not become dark enough. Thereby, contrast was reduced.

On the contrary, in the first embodiment, the absorbing structure 18 is formed to absorb light going toward the top of the light-emitting part which does not emit light due to reflection inside the element or transmission. As a result, the light-emitting part which does not emit light can appear darker than in the conventional structure, thereby improving contrast.

Figure 2:
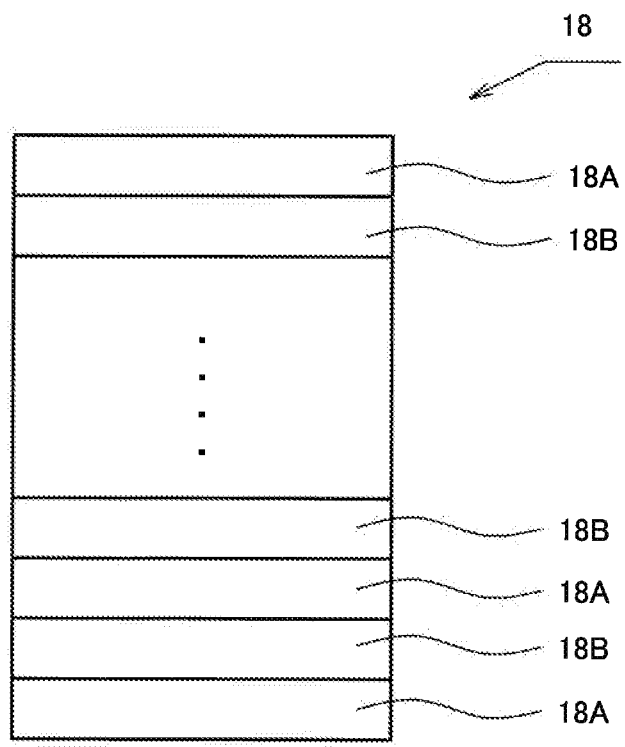
FIG. 2 shows the structure of absorbing structure.

FIG. 2 shows the structure of the absorbing structure 18. As shown in FIG. 2, the absorbing structure 18 is a layered body formed by alternately depositing a dielectric film 18A and a metal film 18B so that the last layer (top layer) is a dielectric film 18A. With such a structure, light can be efficiently absorbed. The reason is as follows.

Firstly, in the absorbing structure 18, reflection of light is suppressed by interference of multilayer film, thereby efficiently absorbing light by the metal film 18B. That is, the thickness of the dielectric film 18A and the metal film 18B is set so that the light reflected at each interface between the dielectric film 18A and the metal film 18B is weakened each other.

Secondly, light is absorbed by a plurality of metal films 18B, and reflection of light by the absorbing structure is reduced. When the metal film 18B is a single layer, a part of light transmits through the metal film 18B. However, when the metal film 18B has a plurality of layers, such transmitted light can be reduced.

The absorbing structure 18 with the above structure, can make wavelength dependency of reflectance or absorptivity low and constant. Therefore, even light from the outside can be efficiently absorbed. Moreover, even in a full-color micro LED display element, light from the light-emitting part can be absorbed, and color change of light is also suppressed.

The absorbing structure 18 with the above structure, can make wavelength dependency of reflectance or absorptivity low and constant. Therefore, even light diagonally incident from the outside or light diagonally emitted from the light-emitting part can be efficiently absorbed.

The last layer is a dielectric film 18A to prevent short circuit with the p-electrode 14 or the n-electrode 15 disposed on the absorbing structure 18. The first layer (a layer in contact with the protective film 17) may be a dielectric film 18A or a metal film 18B.

The dielectric film 18A is preferably made of a material with a high refractive index to reduce reflection at an interface between the dielectric film 18A and the metal film 18B, and to efficiently absorb light by the metal film 18B. For example, $TiO_2$, $Nb_2O_5$, and others may be used.

A plurality of dielectric films 18A may be made of a same material or different materials. For example, the last layer may be made of $SiO_2$, and other layers may be made of a material with a high refractive index such as $TiO_2$ and $Nb_2O_5$. An insulating film made of $SiO_2$ may be formed on the dielectric film 18A as the last layer. Since the last layer is made of $SiO_2$, it can function as a protective film.

The metal film 18B is preferably made of a material with a high absorptivity and a low reflectance to visible light, especially to light with emission wavelength. For example, W, Mo, V, Ta, Cr, Ti, Ni, and TiN may be used. The metal film 18B may be made of alloy, for example, alloy mainly made of metallic element listed above. A plurality of metal films 18B may be made of a same material or different materials.

The thickness of the dielectric film 18A and the metal film 18B is preferably set so that incident angle dependency or wavelength dependency of reflectance of the absorbing structure 18 satisfies the following range. For incident angle dependency, the maximum reflectance is not more than 20%, or preferably not more than 10% in a range where the incident angle is in a range of not more than 70° to light with an emission wavelength of the light-emitting layer 12. Especially in a range where the incident angle is not more than 50°, the maximum reflectance is preferably not more than 5%. For wavelength dependency, when the incident angle is 0° (perpendicular incidence), the maximum reflectance is not more than 10%, or preferably not more than 5% in a range of visible light (400 nm to 700 nm).

The total thickness of the absorbing structure 18 is preferably not more than 1 μm, considering etching processability. The number of layers of the metal film 18B may be the number such that visible light, especially to light with emission wavelength can be sufficiently absorbed. For example, the number of layers is preferably 2 to 5.

The absorbing structure 18 may be formed at least on the top of the transparent electrode 16. This is because in the first embodiment, each light-emitting part is a region just below the transparent electrode 16, and light absorption on the top of the transparent electrode 16 is most effective to improve contrast. Needless to say, as in the first embodiment, the absorbing structure 18 may be formed on the top of the p-type layer 13 not covered by the transparent electrode 16, between light-emitting pixels, or the top of the trench for forming the n-electrode 15, thereby further improving contrast.

In the first embodiment, the absorbing structure 18 is formed on the protective film 17. However, when the first layer of the absorbing structure 18 is a dielectric film 18A, the absorbing structure 18 may be formed directly on the transparent electrode 16 not via the protective film 17.

The side wall insulating film 19 is formed on the side wall of the absorbing structure 18 exposed by the through hole for the p-electrode 14 or the n-electrode 15. The side wall insulating film 19 is formed between the p-electrode 14 and the absorbing structure 18, and between the n-electrode 15 and the absorbing structure 18. The side wall insulating film 19 is a layer to prevent that the metal film 18B of the absorbing structure 18 is exposed at the end, and is in contact with the p-electrode 14 or the n-electrode 1, resulting in short circuit. The side wall insulating film 19 may be formed of the same material as the material of, for example, the protective film 17. The side wall insulating film 19 is made of, for example, $SiO_2$.

A plurality of p-electrodes 14 is in dots on the top of each transparent electrode 16, the absorbing structure 18 and the side wall insulating film 19. The p-electrode 14 is in contact with the transparent electrode 16 via the hole formed in the side wall insulating film 19. The side wall insulating film 19 is disposed between the p-electrode 14 in the hole and the absorbing structure 18, to prevent short circuit between the p-electrode 14 and the metal film 18B of the absorbing structure 18. The p-electrode 14 is made of, for example, Ag. The p-electrode 14 may be directly in contact with the p-type layer 13 without forming the transparent electrode 16.

The n-electrode 15 is a rectangular ring pattern along the outer periphery of the micro LED display element. A trench reaching the n-type layer 11 is formed by etching at the outer periphery of the micro LED display element 1. The n-electrode 15 is formed on the top of the n-type layer 11 exposed in the bottom of the trench, the absorbing structure 18, and the side wall insulating film 19. The n-electrode 15 is in contact with the n-type layer 11 via the hole formed in the side wall insulating film 19. The side wall insulating film 19 is disposed between the n-electrode 15 in the hole and the absorbing structure 18, to prevent short circuit between the n-electrode 15 and the metal film 18B of the absorbing structure 18. One n-electrode is commonly formed among pixels. The n-electrode 15 is made of, for example, a layered body of Ti/Al.

From the above, in the light-emitting device according to the first embodiment, reflected light of light emitted from the light-emitting layer 12, reflected light of light from the outside, and transmitted light from the backside of the substrate can be absorbed, thereby improving contrast.

The light-emitting device according to the first embodiment is a single-color micro LED display element emitting blue light. Needless to say, it is also applicable to a full-color micro LED display element. In the light-emitting device according to the first embodiment, the absorbing structure 18 has a low constant reflectance with respect to full wavelength range of visible light, and does not affect color of the micro LED. Therefore, the absorbing structure 18 of the first embodiment is suitable for the full-color micro LED display element. The full-color micro LED display element may have any well-known structure. The full-color micro LED display element may have a structure having a blue light-emitting layer, a green light-emitting layer, and a red light-emitting layer, a structure having a blue light-emitting layer and a green light-emitting layer and obtaining red by converting blue, or a structure having ultraviolet light-emitting layer and converting ultraviolet into blue, green, and red. In the light-emitting device according to the first embodiment, full color may be achieved by forming a layer converting blue light into green or red light.

In the light-emitting device according to the first embodiment, the light-emitting part is not separated by a trench. However, the light-emitting part may be separated by the trench. Contrast can be improved by separating the light-emitting part. However, it is more superior in terms of micronizing and manufacturing cost when the light-emitting part is not separated as in the first embodiment. When the light-emitting part is not separated, reduction of contrast is more evident due to cross talk. The significance of using the absorbing structure 18 as in the present invention is more increased.

Moreover, in the first embodiment, Group III nitride semiconductor is used as a semiconductor material. However, the present invention is also applicable to when other semiconductor material is used.

The simulation result regarding the first embodiment is described. With respect to a structure in which a transparent electrode, an absorbing structure, and an electrode were deposited on the GaN layer (hereinafter, referred to as "Example 1"), reflectance when light is incident from the GaN layer side was calculated by simulation. The transparent electrode was made of IZO with a thickness of 50 nm, and the electrode was made of Ti. The absorbing structure has a structure in which the first and last layers were made of $TiO_2$, and 50 nm $SiO_2$ was deposited after sequentially depositing $TiO_2$ and W. The thickness of $TiO_2$ and W was set so that the average reflectance of light with a wavelength of 400 nm to 700 nm becomes lowest. As a Comparative Example, reflectance was calculated in the same way with respect to the absorbing structure in which a single layer made of 500 nm $SiO_2$ was substituted for the deposited layers.

Figure 3:
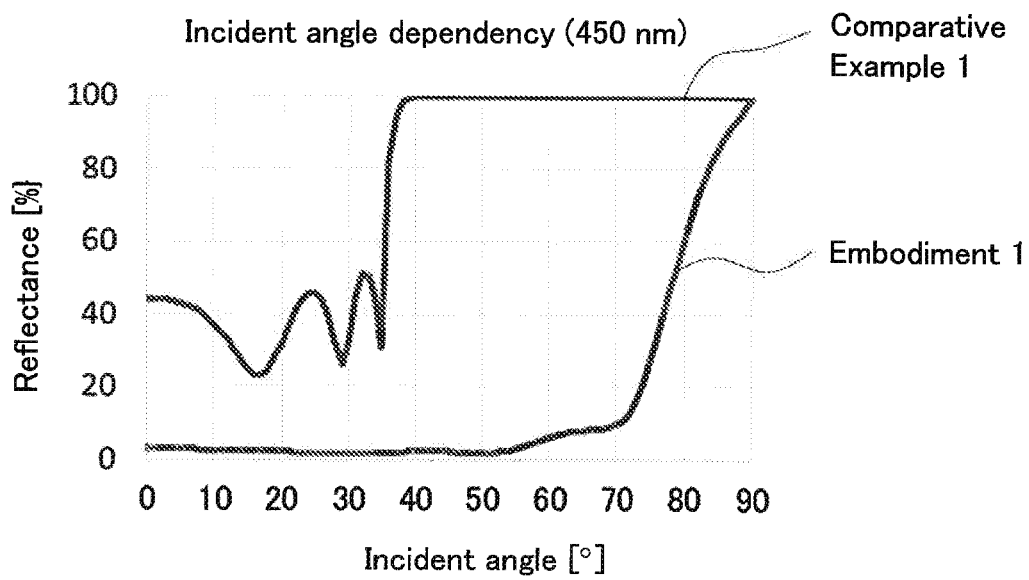
FIG. 3 is a graph showing incident angle dependency of reflectance of absorbing structure.

FIG. 3 is a graph showing incident angle dependency of reflectance of the structures of Example 1 and Comparative Example 1. The wavelength of light was 450 nm. As shown in FIG. 3, in Example 1, reflectance is approximately several % and almost constant when incident angle is not more than 50°, and reflectance is gradually increased but not more than 10% when incident angle is 50° to 70°. It was found that reflectance can be reduced at a wide incident angle. On the other hand, in Comparative Example, reflectance is approximately 20% to 40% at an incident angle of not more than 35°, and reflectance becomes close to 100% when incident angle exceeds 35%, i.e., a critical angle.

Figure 4:
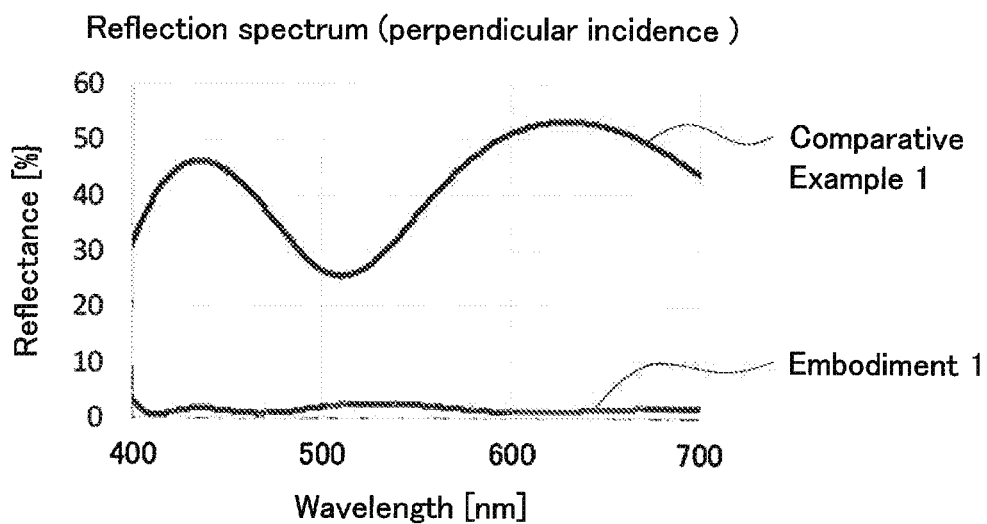
FIG. 4 is a graph showing wavelength dependency of reflectance of absorbing structure.

FIG. 4 is a graph showing wavelength dependency of reflectance of the structures of Example 1 and Comparative Example 1. As shown in FIG. 4, in Example 1, reflectance is approximately several % over a wavelength of 400 nm to 700 nm. Therefore, it was found that an extremely low reflectance is achieved over a wide range of wavelength. On the other hand, in Comparative Example 1, reflectance varies greatly depending on wavelength due to interference, and the reflectance was at minimum approximately 25%. In case of a full-color micro LED display, color may change because reflectance varies depending on wavelength. However, in Example 1, reflectance is low and constant in the whole range of visible light from purple to red. Therefore, color does not change.

Thus, reflectance is sufficiently reduced in the structure of Example 1 more than in the structure of Comparative Example 1. It was found that the absorbing structure of Example 1 is useful for improving contrast of the micro LED display.

In Example 1, when the number of layers of the metal film 18B was varied between 3 to 6 at a wavelength of 450 nm and an incident angle of 0°, reflectance was slightly less when the number of layers was 4 to 6 than when the number of layers was 3. Even when the number of layers was 3, reflectance was sufficiently low. It was found from this that the number of layers may be larger than a certain value.

In Example 1, when the metal film 18B was made of V, Mo, and Cr instead of W at a wavelength 450 nm and an incident angle of 0° with the number of layers of the metal film 18B set as 3, the equivalent reflectance was achieved as when the metal film 18B was made of W, which was sufficiently low. Reflectance was higher when the metal film 18B was made of Ti, Ni, TiN, Ta, Cr, and Pt than when the metal film 18B was made of W, however, which was sufficiently low. On the other hand, when the metal film 18B was made of at least one of Ag, Al, Au, and Cu, reflectance was extremely high. As a result of this, it was found that the metal film 18B is preferably made of a material with a low reflectance and a high absorptivity.

In Example 1, when the dielectric film 18A was made of $Nb_2O_5$ instead of $TiO_2$ at a wavelength 450 nm and an incident angle of 0° with the number of layers of the metal film 18B set as 5, the equivalent reflectance was achieved as when the dielectric film 18A was made of $TiO_2$. When the dielectric film 18A was made of at least one of $Ta_2O_5$, $ZrO_2$, and $HfO_2$, reflectance was slightly higher than when the dielectric film 18A was made of $TiO_2$. When the dielectric film 18A was made of at least one of $SiO_2$, $Y_2O_3$, and $Al_2O_3$, reflectance was higher than when the dielectric film 18A was made of at least one of $Ta_2O_5$, $ZrO_2$, and $HfO_2$. As a result of this, it was found that the dielectric film 18A is preferably made of a material with a high refractive index.

Second Embodiment

With reference to the drawings, specific second embodiment of the light-emitting device and the production method therefor as an example will next be described. However, the present invention is not limited to these embodiments. The below-described depositing structure of the layers of the semiconductor device and the electrode structure are given only for the illustration purpose, and other depositing structures differing therefrom may also be employed. The thickness of each of the layers shown in the drawings is not an actual value, but a conceptual value.

1. Light-Emitting Device

Figure 5:
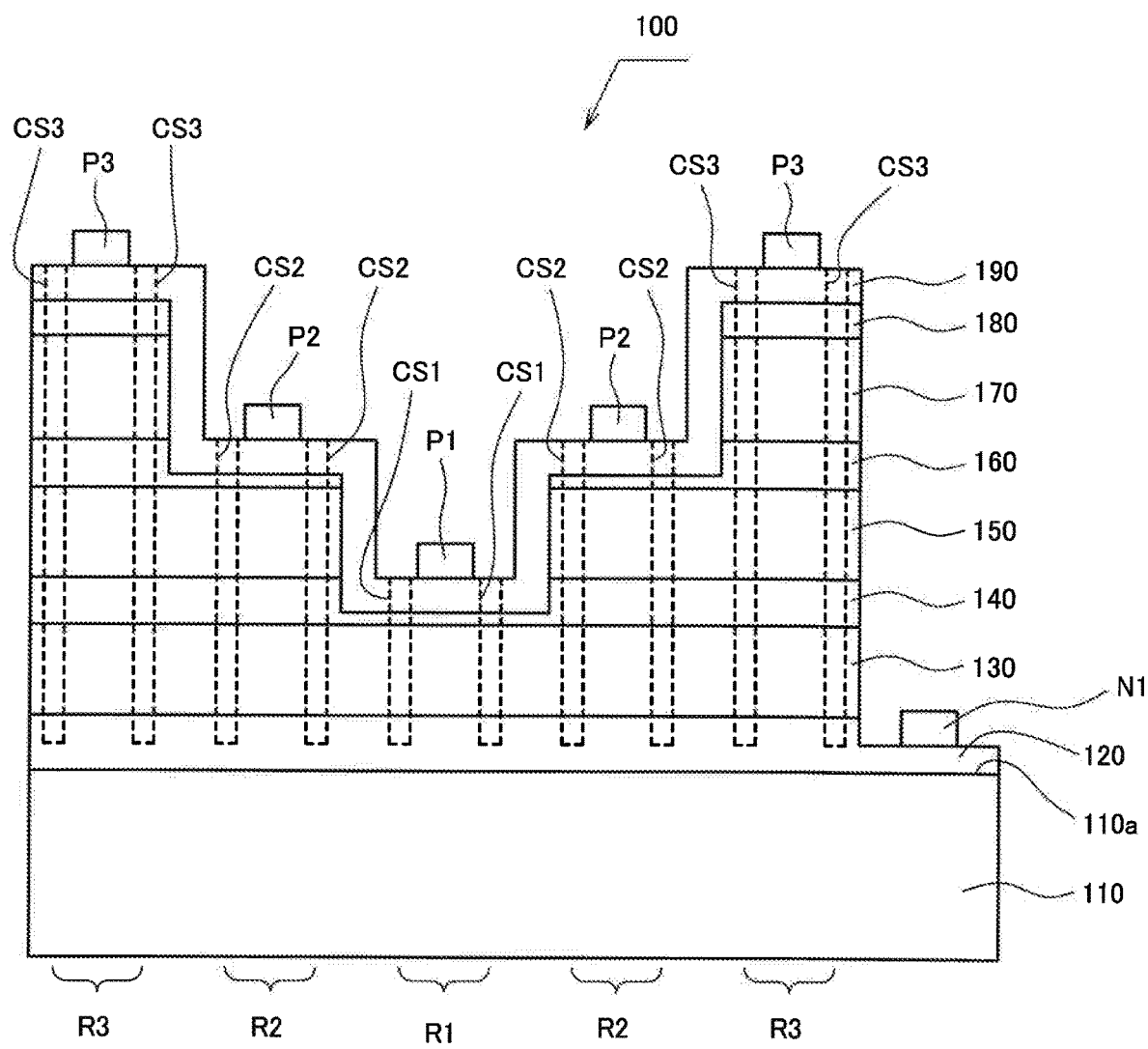
FIG. 5 is a schematic view of the structure of a light-emitting device 100 according to a second embodiment.

FIG. 5 is a schematic view of the structure of a light-emitting device 100 according to a second embodiment. The light-emitting device 100 is a monolithic element. The light-emitting device 100 includes a plurality of Group III nitride semiconductor layers. As shown in FIG. 5, the light-emitting device 100 includes a substrate 110, an n-type contact layer 120, a first light-emitting layer 130, a first intermediate layer 140, a second light-emitting layer 150, a second intermediate layer 160, a third light-emitting layer 170, a cap layer 180, a p-type contact layer 190, an n-electrode N1, p-electrodes P1, P2, and P3, and current suppressing parts CS1, CS2, and CS3. The first light-emitting layer 130, the second light-emitting layer 150, and the third light-emitting layer 170 are a sub light-emitting layer which is a part of the deposition structure of the light-emitting layer.

On a first surface 110a of the substrate 110, the n-type contact layer 120, the first light-emitting layer 130, the first intermediate layer 140, the second light-emitting layer 150, the second intermediate layer 160, the third light-emitting layer 170, the cap layer 180, and the p-type contact layer 190 are formed in this order. The n-electrode N1 is formed on the n-type contact layer 120. The p-electrodes P1, P2, and P3 are formed on the p-type contact layer 190.

The n-type contact layer 120 is an n-type semiconductor layer. The p-type contact layer 190 is a p-type semiconductor layer. The first light-emitting layer 130, the first intermediate layer 140, the second light-emitting layer 150, the second intermediate layer 160, and the third light-emitting layer 170 are an undoped semiconductor layer. The cap layer 180 is an n-type semiconductor layer or an undoped semiconductor layer. Here, the undoped semiconductor layer refers to an intentionally undoped semiconductor layer.

The light-emitting device 100 includes a first light-emitting region R1, a second light-emitting region R2, and a third light-emitting region R3. The first light-emitting region R1, a second light-emitting region R2, and a third light-emitting region R3 are arranged in parallel on the first surface 110a of the substrate 110. Each of the first to third light-emitting regions is a light-emitting part.

The first light-emitting region R1, for example, emits blue light. The first light-emitting region R1 includes a substrate 110, an n-type contact layer 120, a first light-emitting layer 130, a first intermediate layer 140, a p-type contact layer 190, a p-electrode P1, and a current suppressing part CS1. The sub light-emitting layer bearing light emission of the first light-emitting region R1 (light-emitting part) is the first light-emitting layer 130. In the first light-emitting region R1, the p-type contact layer 190 is formed on the first intermediate layer 140.

The second light-emitting region R2, for example, emits green light. The second light-emitting region R2 includes a substrate 110, an n-type contact layer 120, a first light-emitting layer 130, a first intermediate layer 140, a second light-emitting layer 150, a second intermediate layer 160, a p-type contact layer 190, a p-electrode P2, and a current suppressing part CS2. In the second light-emitting region R2, the p-type contact layer 190 is formed on the second intermediate layer 160. The sub light-emitting layer bearing light emission of the second light-emitting region R2 (light-emitting part) is the second light-emitting layer 150.

The third light-emitting region R3, for example, emits red light. The third light-emitting region R3 includes a substrate 110, an n-type contact layer 120, a first light-emitting layer 130, a first intermediate layer 140, a second light-emitting layer 150, a second intermediate layer 160, a third light-emitting layer 170, a cap layer 180, a p-type contact layer 190, a p-electrode P3, and a current suppressing part CS3. In the third light-emitting region R3, the p-type contact layer 190 is formed on the cap layer 180. The sub light-emitting layer bearing light emission of the third light-emitting region R3 (light-emitting part) is the third light-emitting layer 170. The current suppressing parts CS1, CS2, and CS3 are a shielding wall to prevent leakage of current flowing through each light-emitting part and also to prevent leakage of light emitted from each light-emitting part to other light-emitting part.

The substrate 110 is a support substrate supporting semiconductor layers. The substrate 110 has a first surface 110a. The first surface 110a of the substrate 110 is, for example, a c-plane. The substrate 110 is, for example, a different kind substrate such as sapphire substrate, AlN substrate, Si substrate, and SiC substrate. The substrate 110 may be a GaN substrate.

The n-type contact layer 120 is a layer in contact with the n-electrode N1. The n-type contact layer 120 is formed on the first surface 110a of the substrate 110. The n-type contact layer 120 is, for example, Si-doped n-type GaN layer. The n-type contact layer 120 may be an n-type AlGaN layer.

The first light-emitting layer 130 is an active layer emitting light through recombination of an electron with a hole. The first light-emitting layer 130 is disposed between the n-type contact layer 120 and the first intermediate layer 140. The first light-emitting layer 130 has a well layer and a barrier layer. The well layer of the first light-emitting layer 130 is, for example, an $In_xGa_{1-x}N$ layer. The barrier layer of the first light-emitting layer 130 is, for example, a GaN layer. The well layer of the first light-emitting layer 130 has an In molar ratio x of, for example, 0.14 to 0.22.

The first intermediate layer 140 is a layer disposed between the first light-emitting layer 130 and the second light-emitting layer 150. The band gap of the first intermediate layer 140 is larger than the band gap of the well layer of the first light-emitting layer 130, the second light-emitting layer 150, and the third light-emitting layer 170. The first intermediate layer 140 is made of, for example, AlInGaN.

The second light-emitting layer 150 is an active layer emitting light through recombination of an electron and a hole. The second light-emitting layer 150 is disposed between the first intermediate layer 140 and the second intermediate layer 160. The second light-emitting layer 150 has a well layer and a barrier layer. The well layer of the second light-emitting layer 150 is, for example, an $In_xGa_{1-x}N$ layer. The barrier layer of the second light-emitting layer 150 is, for example, an GaN layer. The well layer of the second light-emitting layer 150 has an In molar ratio x of, for example, 0.26 to 0.33.

The second intermediate layer 160 is a layer disposed between the second light-emitting layer 150 and the third light-emitting layer 170. The band gap of the second intermediate layer 160 is larger than the band gap of the well layers of the first light-emitting layer 130, the second light-emitting layer 150, and the third light-emitting layer 170. The second intermediate layer 160 is made of, for example, AlInGaN.

The third light-emitting layer 170 is an active layer emitting light through recombination of an electron and a hole. The third light-emitting layer 170 is disposed between the second intermediate layer 160 and the cap layer 180. The third light-emitting layer 170 has a well layer and a barrier layer. The well layer of the third light-emitting layer 170 is, for example, an $In_xGa_{1-x}N$ layer. The barrier layer of the third light-emitting layer 170 is, for example, a GaN layer. The well layer of the third light-emitting layer 170 has an In molar ratio x of, for example, 0.39 to 0.48.

The cap layer 180 is a layer disposed between the third light-emitting layer 170 and the p-type contact layer 190. The band gap of the cap layer 180 is larger than the band gap of the well layer of the first light-emitting layer 130, the second light-emitting layer 150, and the third light-emitting layer 170. The cap layer 180 is made of, for example, AlInGaN.

The p-type contact layer 190 is a semiconductor layer electrically connected with the p-electrode P1. The p-type contact layer 190 is in contact with the p-electrode P1. The p-type contact layer 190 is formed on the first intermediate layer 140, the second intermediate layer 160, and the cap layer 180. The p-type contact layer 190 covers the side surfaces of the first intermediate layer 140, the second light-emitting layer 150, the second intermediate layer 160, the third light-emitting layer 170, and the cap layer 180. The p-type contact layer 190 covers the semiconductor layer on the first surface 110a side of the substrate 110. The p-type contact layer 190 is a continuous layer. The p-type contact layer 190 is continuously formed over the first light-emitting region R1, the second light-emitting region R2, and the third light-emitting region R3. The p-type contact layer 190 is, for example, a Mg-doped p-type GaN layer. The p-type contact layer 190 may be a p-type AlGaN layer.

The p-electrodes P1, P2, and P3 are electrically connected with the p-type contact layer 190. The p-electrodes P1, P2, and P3 are formed on and in contact with the p-type contact layer 190. The p-electrodes P1, P2, and P3 are made of, for example, ITO. The p-electrodes P1, P2, and P3 may be made of transparent conductive oxide such as IZO, ICO, ZnO, $TiO_2$, $NbTiO_2$, and $TaTiO_2$ other than ITO. The p-electrodes P1, P2, and P3 may contain, for example, a metal layer or an alloy layer such as Ni, Au, Ag, Co, and In. The p-electrodes P1, P2, and P3 are formed in regions independent of each other. Therefore, these p-electrodes P1, P2, and P3 are not continuous.

The n-electrode N1 is electrically connected with the n-type contact layer 120. The n-electrode N1 is formed on and in contact with the n-type contact layer 120. The n-electrode N1 is made of, for example, a metal such as Ni, Au, Ag, Co, In, and Ti.

The p-type contact layer 190 of the first light-emitting region R1, the p-type contact layer 190 of the second light-emitting region R2, and the p-type contact layer 190 of the third light-emitting region R3 are continuous with the current suppressing parts CS1, CS2, and CS3 interposed therebetween.

The n-type contact layer 120 is common among the first light-emitting region R1, the second light-emitting region R2, and the third light-emitting region R3. The light-emitting device 100 includes one n-electrode on the n-type contact layer 120. The light-emitting device 100 has one p-electrode for each subpixel.

The film thickness of the n-type contact layer 120 is, for example, 1 μm to 5 μm. The film thickness of the first light-emitting layer 130, the second light-emitting layer 150, and the third light-emitting layer 170 is, for example, 6 nm to 100 nm. The film thickness of the first intermediate layer 140 and the second intermediate layer 160 is, for example, 2 nm to 100 nm. The film thickness of the cap layer 180 is, for example, 5 nm to 10 nm. The film thickness of the p-type contact layer 190 is, for example, 10 nm to 200 nm.

2. Band Structure and Behavior of Electron and Hole 2-1. Band Structure

Figure 6:
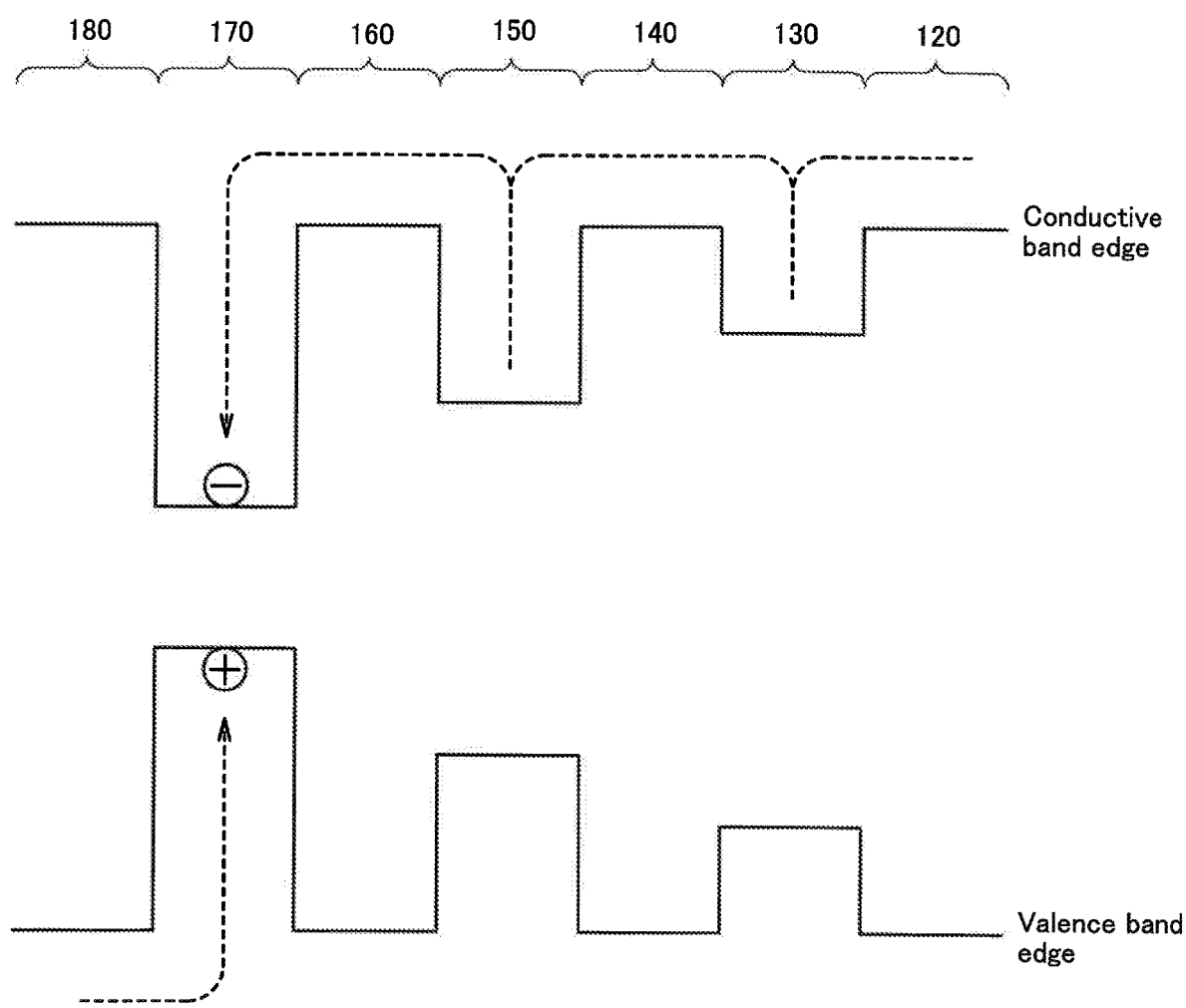
FIG. 6 is a conceptual view showing band structure and behavior of electron and hole in the light-emitting device 100 according to the second embodiment.

FIG. 6 is a conceptual view showing band structure, and behavior of electron and hole in the light-emitting device 100 according to the second embodiment. FIG. 6 shows the band structure in the semiconductor deposition structure of the red light-emitting region R3 where the cap layer 180 is disposed. In FIG. 6, for ease of explanation, each light-emitting layer is drawn to have a single quantum well structure. Each light-emitting layer may have a multiple quantum well structure.

As shown in FIG. 6, the band gap of the well layer of the third light-emitting layer 170 is smaller than the band gap of the well layer of the second light-emitting layer 150. The band gap of the well layer of the second light-emitting layer 150 is smaller than the band gap of the well layer of the first light-emitting layer 130. Therefore, the emission wavelengths of the first light-emitting layer 130, the second light-emitting layer 150, and the third light-emitting layer 170 are different each other.

2-2. Behavior of Electron and Hole

Holes injected from the p-electrode P3 easily enter the third light-emitting layer 170. Holes hardly move from the third light-emitting layer 170, and remain in the third light-emitting layer 170. The valence band of the third light-emitting layer 170 has sufficiently high barrier for the valence band of the second intermediate layer 160.

Electrons injected from the n-electrode N1 enter the first light-emitting layer 130. The conduction band of the first light-emitting layer 130 has not so high barrier for the conductive band of the first intermediate layer 140. Therefore, electrons easily move from the first light-emitting layer 130 to the second light-emitting layer 150. The conductive band of second light-emitting layer 150 has not so high barrier for the conductive band the second intermediate layer 160. Therefore, electrons easily move from the second light-emitting layer 150 to the third light-emitting layer 170. Most of the electrons entered the third light-emitting layer 170 remain in the third light-emitting layer 170 without overflowing. This is because the conductive band of the third light-emitting layer 170 has sufficiently high barrier for the conductive band of the cap layer 180.

Thus, electrons easily exist in the conductive band of the third light-emitting layer 170, and holes easily exist in the valence band of the third light-emitting layer 170. That is, wave function of electrons and wave function of holes have large amplitude and are often overlapped each other at the third light-emitting layer 170. Therefore, light is intensively emitted from the third light-emitting layer 170, and not much light is emitted from the first light-emitting layer 130 and the second light-emitting layer 150.

When the third light-emitting layer 170 does not exist, light is intensively emitted from the second light-emitting layer 150, and not much light is emitted from the first light-emitting layer 130.

Similarly, in the green light-emitting region R2, light is emitted from the second light-emitting layer 150 close to the p-electrode P2. In the blue light-emitting region R1, light is emitted from the first light-emitting layer 130.

3. Shielding Wall (Current Suppressing Part)

3-1. Region of Current Suppressing Part

Hereinafter, shielding wall refers to as "current suppressing part". As shown in FIG. 5, the light-emitting device 100 includes the current suppressing parts CS1, CS2, and CS3. The current suppressing parts CS1, CS2, and CS3 are formed of a material having high electric resistivity. The current suppressing parts CS1, CS2, and CS3 are made of, for example, Group III nitride containing oxygen atoms.

The current suppressing part CS1 suppresses current from diffusing in a direction parallel to the first surface 110a of the substrate 110. The current suppressing part CS1 cylindrically surrounds the first light-emitting region R1. The current suppressing part CS1 reaches from the p-type contact layer 190 to the middle of the n-type contact layer 120.

The current suppressing part CS2 suppresses current from diffusing in a direction parallel to the first surface 110a of the substrate 110. The current suppressing part CS2 cylindrically surrounds the second light-emitting region R2. The current suppressing part CS2 reaches from p-type contact layer 190 to the middle of the n-type contact layer 120.

The current suppressing part CS3 suppresses current from diffusing in a direction parallel to the first surface 110a of the substrate 110. The current suppressing part CS3 cylindrically surrounds the third light-emitting region R3. The current suppressing part CS3 reaches from p-type contact layer 190 to the middle of the n-type contact layer 120.

The current suppressing parts CS1, CS2, and CS3 are a layer having electric resistivity higher than that of the p-type contact layer 190, the third light-emitting layer 170, the second light-emitting layer 150, and the first light-emitting layer 130.

The current suppressing part CS1 divides the first light-emitting layer 130 into sub pixels, and cylindrically surrounds the first light-emitting layer 130. The current suppressing part CS2 divides the second light-emitting layer 150 into sub pixels, and cylindrically surrounds the second light-emitting layer 150. The current suppressing part CS3 divides the third light-emitting layer 170 into sub pixels, and cylindrically surrounds the third light-emitting layer 170.

Figure 7:
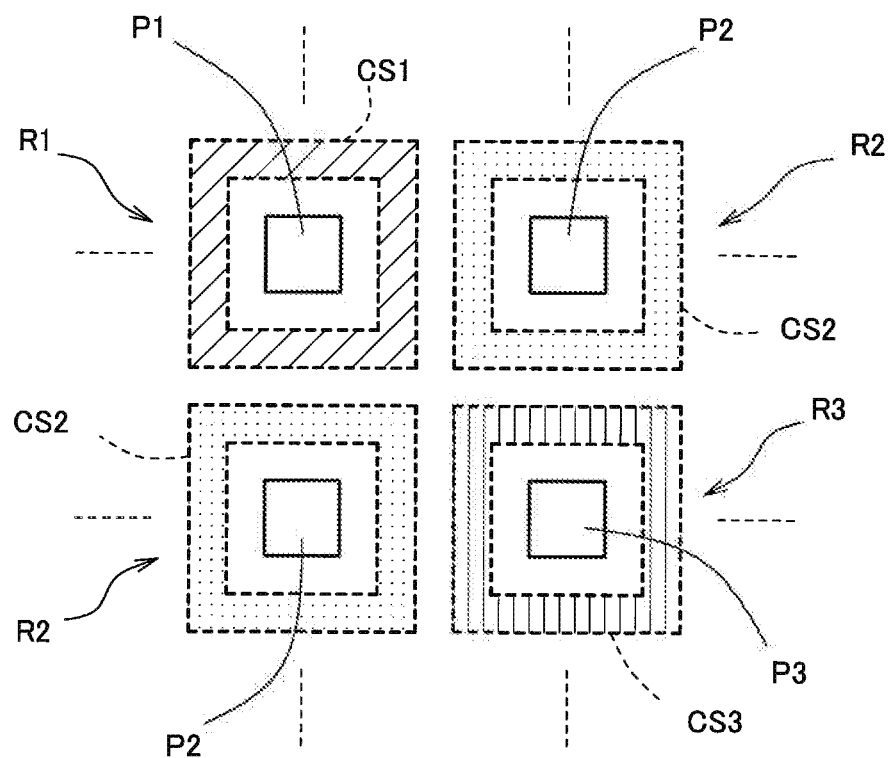
FIG. 7 is a view showing the arrangement of light-emitting regions in the light-emitting device 100 according to the second embodiment.

FIG. 7 is a view showing the arrangement of light-emitting regions in the light-emitting device 100 according to the second embodiment. FIG. 7 is a view of the light-emitting device 100 viewed from a direction perpendicular to the first surface 110a of the substrate 110.

As shown in FIG. 7, the current suppressing part CS1 surrounds the first light-emitting region R1. The current suppressing part CS2 surrounds the second light-emitting region R2. The current suppressing part CS3 surrounds the third light-emitting region R3.

As shown in FIGS. 5 and 7, the current suppressing part CS1 square cylindrically surrounds the first light-emitting region R1. The current suppressing part CS2 square cylindrically surrounds the second light-emitting region R2. The current suppressing part CS3 square cylindrically surrounds the third light-emitting region R3.

3-2. Current Flow

Figure 8:
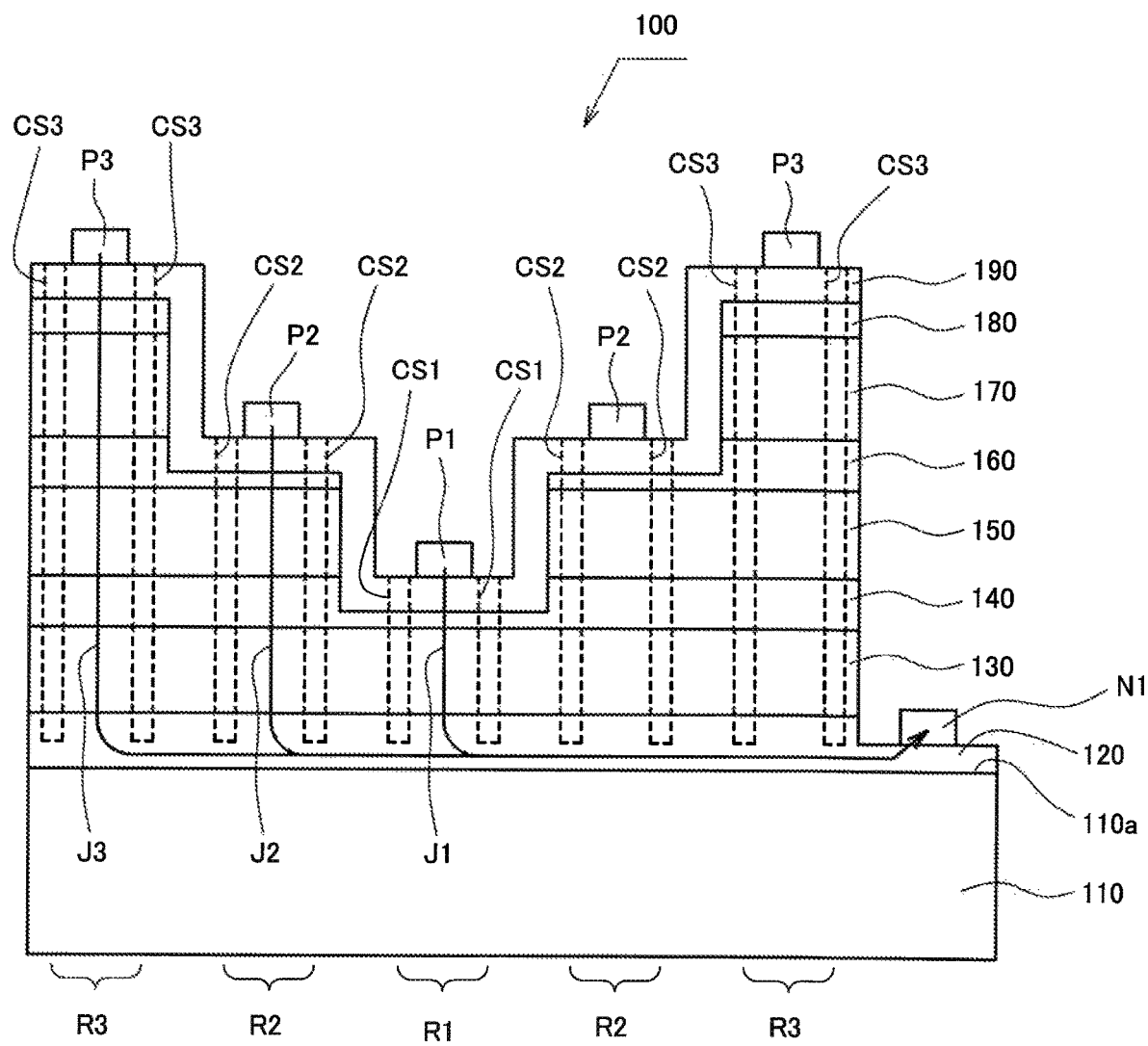
FIG. 8 is a view showing current flow in the light-emitting device 100 according to the second embodiment.

FIG. 8 is a view showing current flow in the light-emitting device 100 according to the second embodiment.

When a sufficiently high voltage was applied between the p-electrode P1 and the n-electrode N1, current flows in the order of the p-type contact layer 190, the first intermediate layer 140, the first light-emitting layer 130, and the n-type contact layer 120. Thereby, the first light-emitting layer 130 of the first light-emitting region R1 emits blue light. Because of the existence of the current suppressing part CS1, current does not diffuse in the second light-emitting region R2 and the third light-emitting region R3. Therefore, the light-emitting device 100 exhibits sufficient contrast, and light emission of unintentional color is suppressed When a sufficiently high voltage was applied between the p-electrode P2 and the n-electrode N1, current flows in the order of the p-type contact layer 190, the second intermediate layer 160, the second light-emitting layer 150, the first intermediate layer 140, the first light-emitting layer 130, and the n-type contact layer 120. Thereby, the second light-emitting region R2 emits light. Although current flows in the first light-emitting layer 130, the hole concentration of the second light-emitting layer 150 is higher than the hole concentration of the first light-emitting layer 130. Therefore, green light is emitted from the second light-emitting layer 150. Because of the existence of the current suppressing part CS2, current does not diffuse in the first light-emitting region R1 and the third light-emitting region R3. Therefore, the light-emitting device 100 exhibits sufficient contrast, and light emission of unintentional color is suppressed.

When a sufficiently high voltage was applied between the p-electrode P3 and the n-electrode N1, current flows in the order of the p-type contact layer 190, the cap layer 180, the third light-emitting layer 170, the second intermediate layer 160, the second light-emitting layer 150, the first intermediate layer 140, the first light-emitting layer 130, and the n-type contact layer 120. Thereby, only the third light-emitting layer 170 emits light because the hole concentration of the third light-emitting layer 170 closest to the p-electrode P3 of the third light-emitting region R3 is highest. Because of the existence of the current suppressing part CS3, current does not diffuse in the first light-emitting region R1 and the second light-emitting region R2. Therefore, the light-emitting device 100 exhibits sufficient contrast, and light emission of unintentional color is suppressed.

4. Method for Producing Semiconductor Light-Emitting Device

4-1. Forming Semiconductor Layer

Figure 9:
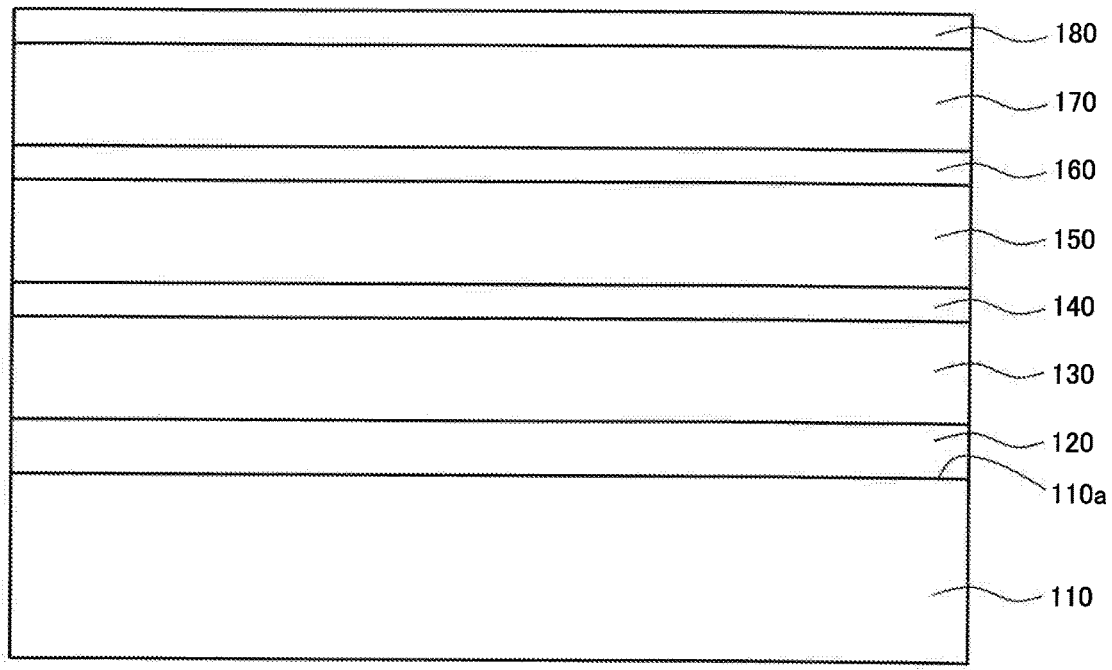
FIG. 9 is a view (part 1) explaining a method for producing the light-emitting device 100 according to the second embodiment.

As shown in FIG. 9, semiconductor layer is epitaxially grown on the first surface 110a of the substrate 110. In this process, vapor phase growth method such as MOCVD may be used. An n-type contact layer 120, a first light-emitting layer 130, a first intermediate layer 140, a second light-emitting layer 150, a second intermediate layer 160, a third light-emitting layer 170, and a cap layer 180 are formed in this order on the first surface 110a of the substrate 110.

4-2. Exposing Intermediate Layer

Figure 10:
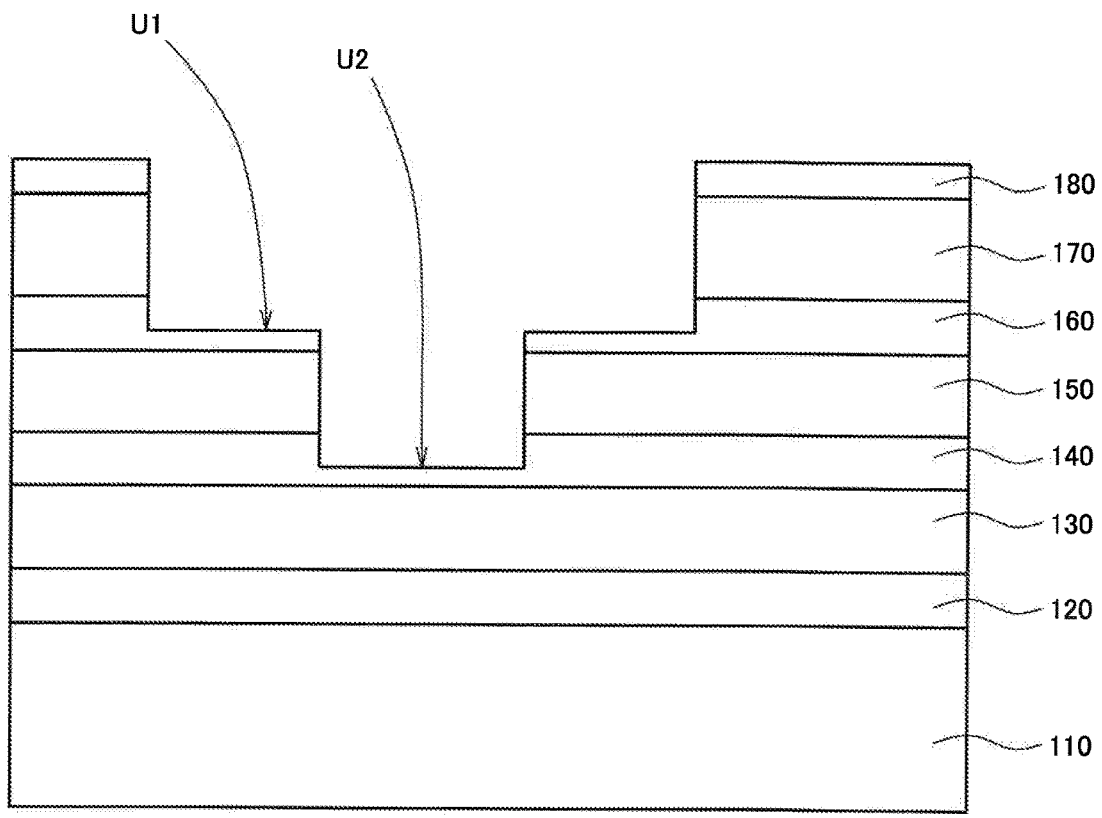
FIG. 10 is a view (part 2) explaining a method for producing the light-emitting device 100 according to the second embodiment.

As shown in FIG. 10, recesses U1 and U2 are formed on the semiconductor layer to expose a part of the first intermediate layer 140 and the second intermediate layer 160. For that, the semiconductor layer may be etched using a mask. The second intermediate layer 160 is exposed in the bottom of the recess U1. The first intermediate layer 140 is exposed in the bottom of the recess U2.

4-3. Forming p-Type Semiconductor Layer

Figure 11:
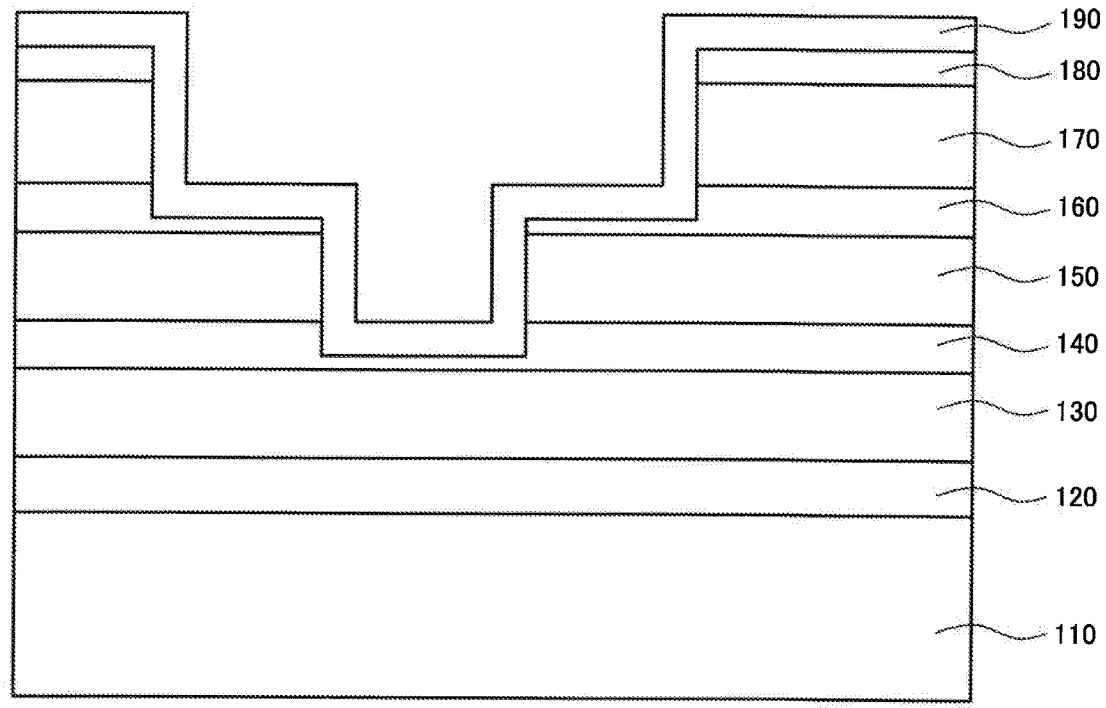
FIG. 11 is a view (part 3) explaining a method for producing the light-emitting device 100 according to the second embodiment.

As shown in FIG. 11, the p-type contact layer 190 is grown on the semiconductor layer. The p-type contact layer 190 is formed over the top surfaces of the first intermediate layer 140, the second intermediate layer 160, and the cap layer 180. At that time, the p-type contact layer 190 is also formed on the side surfaces of the first intermediate layer 140, the second light-emitting layer 150, the second intermediate layer 160, the third light-emitting layer 170, and the cap layer 180.

4-4. Forming Shielding Wall (Current Suppressing Part)

Figure 12:
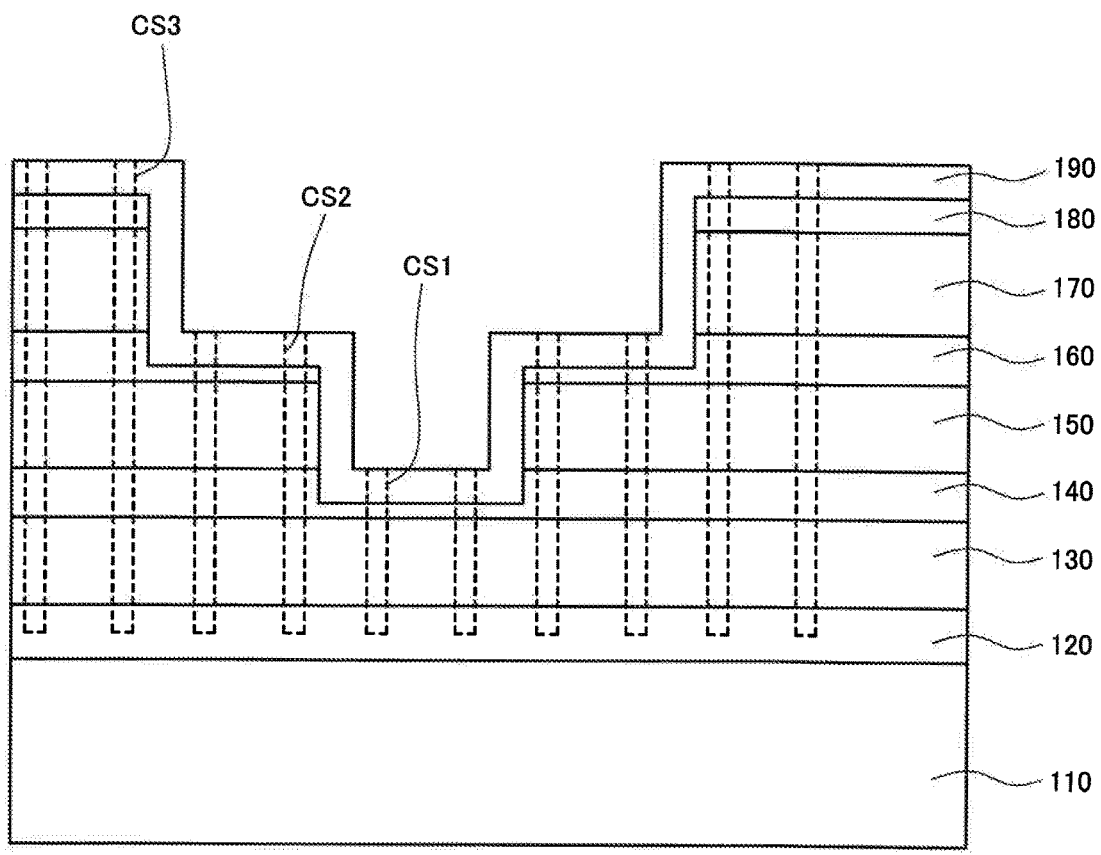
FIG. 12 is a view (part 4) explaining a method for producing the light-emitting device 100 according to the second embodiment.

As shown in FIG. 12, the current suppressing parts CS1, CS2, and CS3 are formed in the semiconductor layer. For that, for example, ion is implanted into a region of the semiconductor layer on which the current suppressing parts CS1, CS2, and CS3 are formed. For example, a mask is formed on the p-type contact layer 190, oxygen gas is made into plasma, and oxygen ions are implanted into a region not covered by the mask. Specifically, ions are implanted into a region cylindrically surrounding the first light-emitting layer 130, the second light-emitting layer 150, and the third light-emitting layer 170. As a result, the first light-emitting layer 130, the second light-emitting layer 150, and the third light-emitting layer 170 are divided into isolated sub pixels. In such a way, the current suppressing parts CS1, CS2, and CS3 reaching from the p-type contact layer 190 to the middle of the n-type contact layer 120, are formed.

4-5. Forming Electrode

Figure 13:
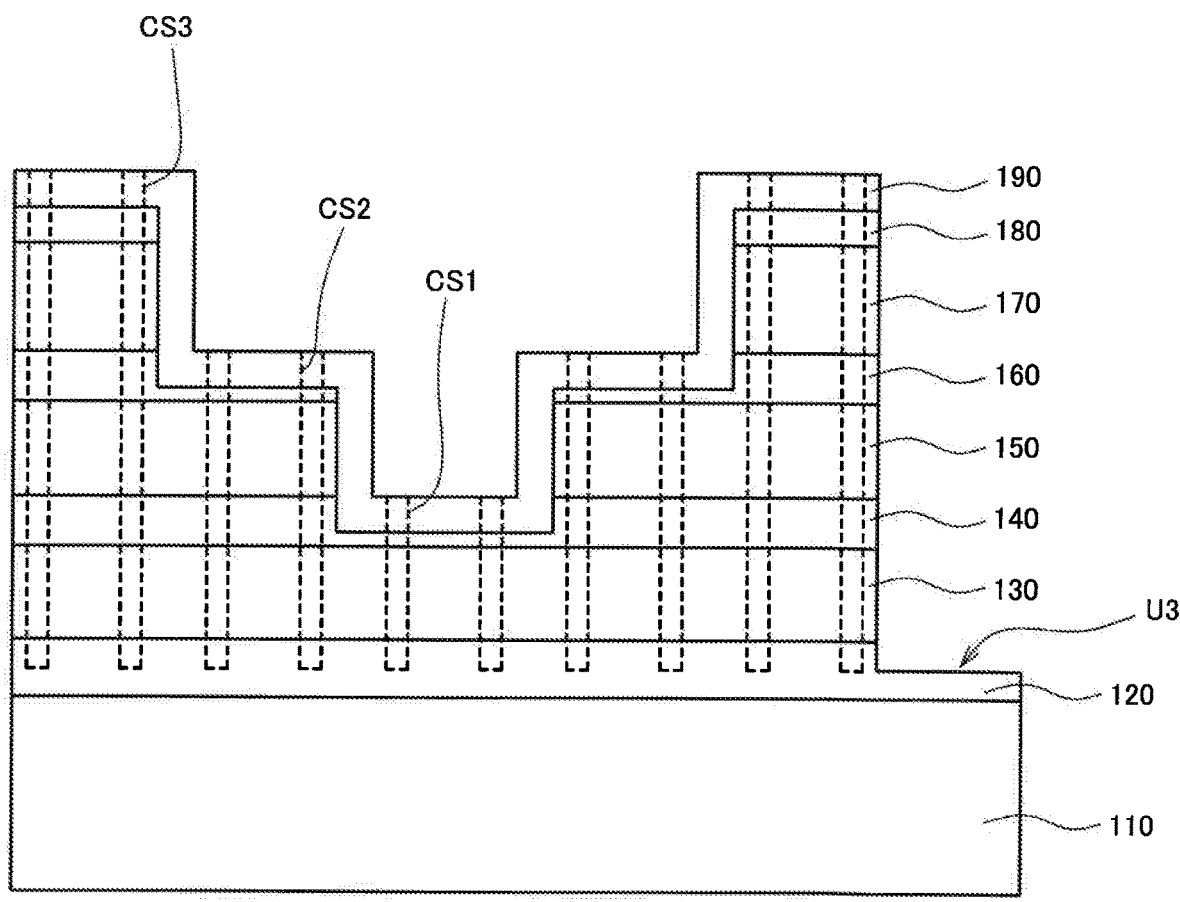
FIG. 13 is a view (part 5) explaining a method for producing the light-emitting device 100 according to the second embodiment.

As shown in FIG. 13, a recess U3 is formed to form the n-type contact layer 120. The recess U3 reaches from the p-type contact layer 190 to the middle of the n-type contact layer 120. The n-type contact layer 120 is exposed in the bottom of the recess U3. After this, the n-electrode N1 is formed on the n-type contact layer 120, and the p-electrodes P1, P2, and P3 are formed on the p-type contact layer 190. When forming the p-electrodes P1, P2, and P3, the electrode layer may be divided into a plurality of electrodes by etching after a uniform electrode layer is formed.

5. Effect of Second Embodiment

The light-emitting device 100 according to the second embodiment includes the current suppressing parts CS1, CS2, and CS3 reaching from the p-type contact layer 190 to the middle of the n-type contact layer 120. The current suppressing part CS1 cylindrically surrounds the first light-emitting region R1. The current suppressing part CS2 cylindrically surrounds the second light-emitting region R2. The current suppressing part CS3 cylindrically surrounds the third light-emitting region R3.

Therefore, current is suppressed from diffusing in the adjacent regions. When the monolithic element emits light, only the target sub pixel emits light, and other adjacent sub pixels hardly emit light. That is, the light-emitting device 100 has high contrast.

6. Variations
6-1. Existence Region of Current Suppressing Part

Figure 14:
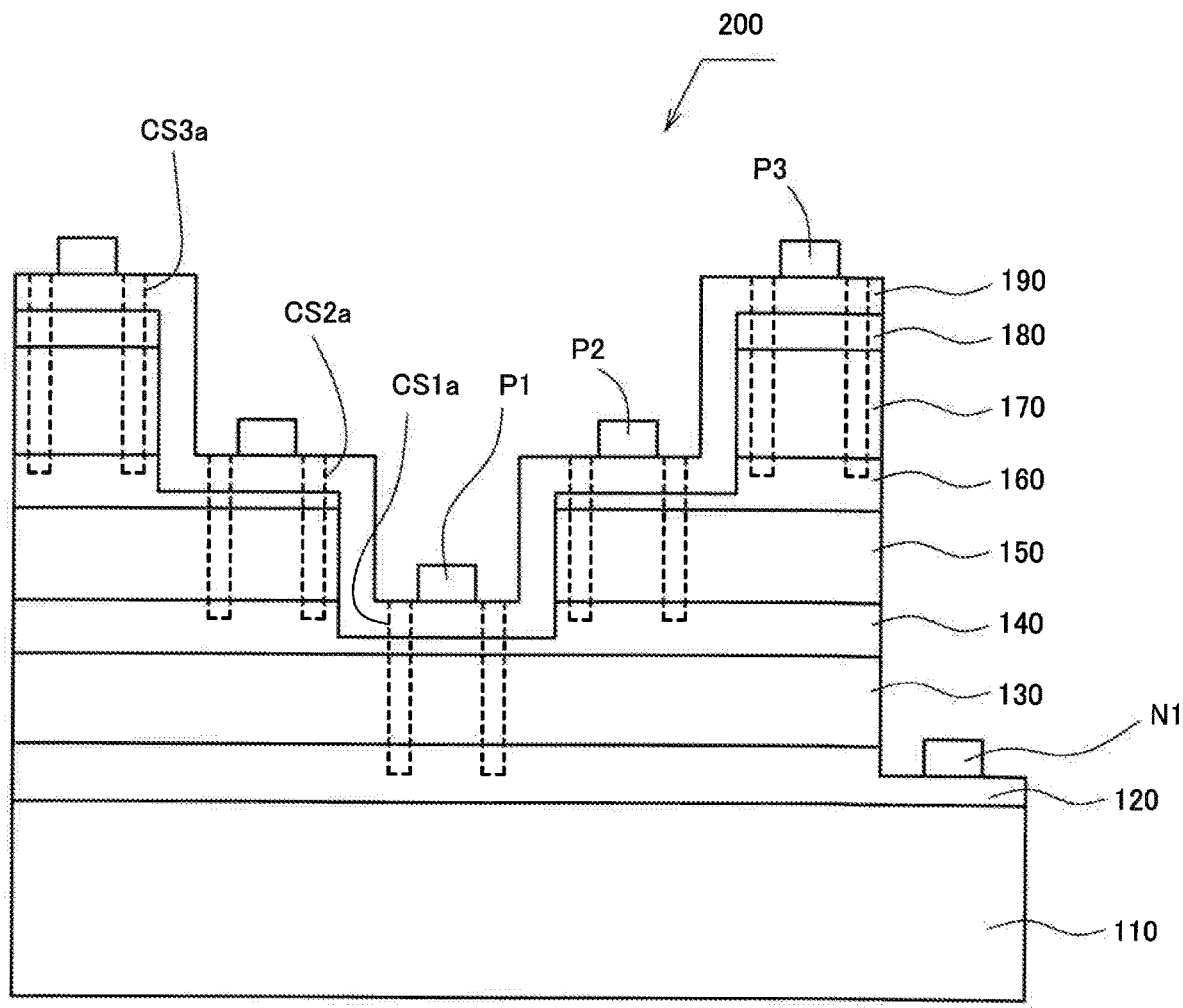
FIG. 14 is a schematic view of the structure of a light-emitting device 200 according to a variation of the second embodiment.

FIG. 14 is a schematic view of the structure of a light-emitting device 200 according to a variation of the second embodiment. The light-emitting device 200 includes current suppressing parts CS1a, CS2a, and CS3a. The current suppressing part CS1a reaches from the p-type contact layer 190 to the middle of the n-type contact layer 120. The current suppressing part CS2a reaches from the p-type contact layer 190 to the middle of the first intermediate layer 140. The current suppressing part CS3a reaches from the p-type contact layer 190 to the middle of the second intermediate layer 160.

The current suppressing parts CS2a and CS3a do not reach the n-type contact layer 120. However, the current suppressing parts CS1a, CS2a, and CS3a suppress current from diffusing in a lateral direction in the p-type contact layer 190.

When each light-emitting layer is sufficiently thin, and the n-type contact layer 120 is sufficiently thick, the light-emitting device 100 can be easily produced. However, when each light-emitting layer is thick to a certain degree, the current suppressing part sometimes does not reach the n-type contact layer 120 as in the light-emitting device 200. The depth of the current suppressing parts CS1a, CS2a, and CS3a is not necessarily the same as in FIG. 14.

6-2. P-Electrode

Figure 15:
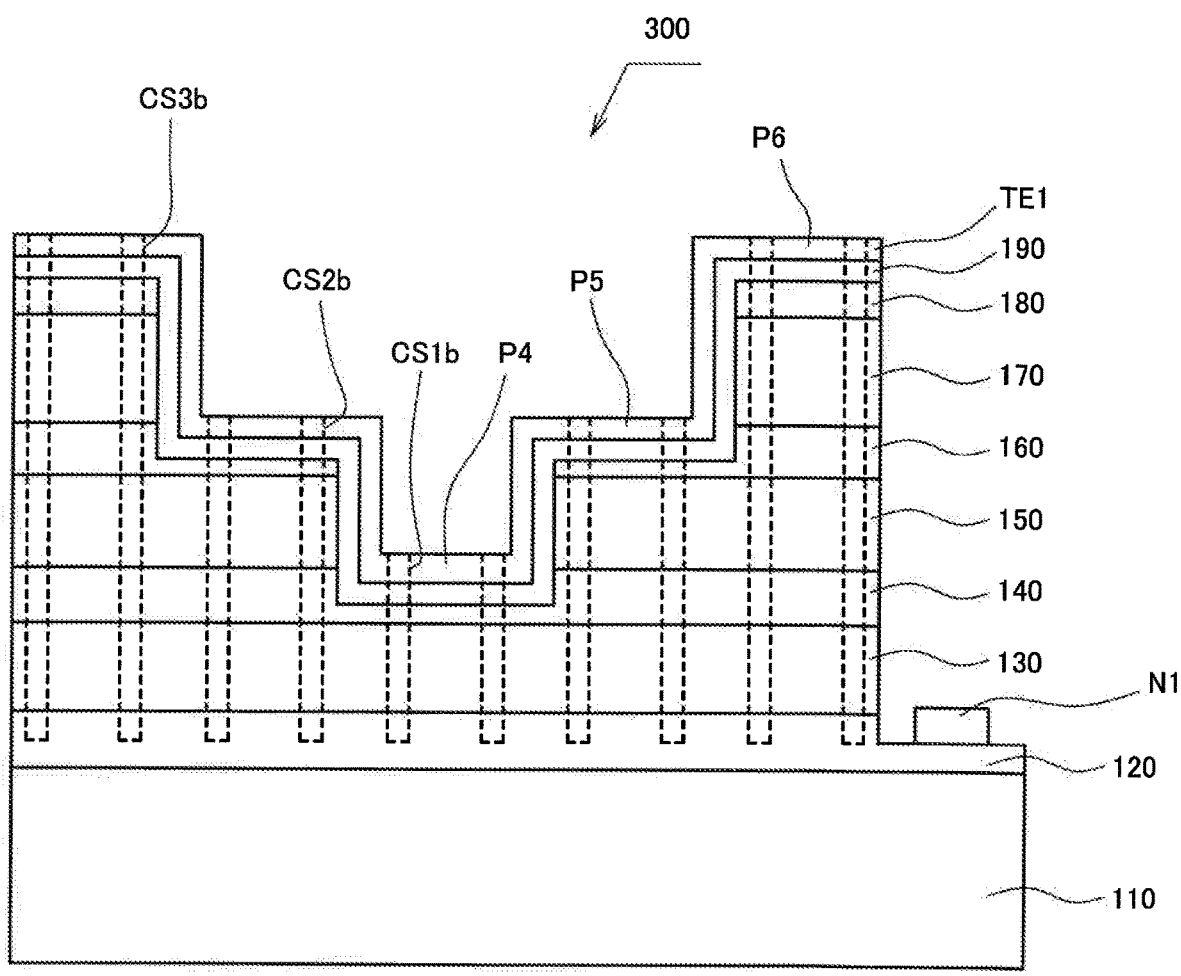
FIG. 15 is a schematic view of the structure of a light-emitting device 300 according to a variation of the second embodiment.

FIG. 15 is a schematic view of the structure of a light-emitting device 300 according to a variation of the second embodiment. The light-emitting device 300 includes a transparent electrode TE1 uniformly formed on the first surface 110a side of the substrate 110. The transparent electrode TE1 is made of transparent conductive oxide such as ITO, IZO, ICO, ZnO, $TiO_2$, $NbTiO_2$, and $TaTiO_2$.

The transparent electrode TE1 is formed on the p-type contact layer 190. The transparent electrode TE1 of the first light-emitting region R1, the transparent electrode TE1 of the second light-emitting region R2, and the transparent electrode TE1 of the third light-emitting region R3 are continuously connected such that the current suppressing parts CS1b, CS2b, and CS3b are interposed therebetween. The current suppressing part CS1b cylindrically surrounds the first light-emitting layer 130 and the transparent electrode TE1. The current suppressing part CS2b surrounds the second light-emitting layer 150 and the transparent electrode TE1. The current suppressing part CS3b surrounds the third light-emitting layer 170 and the transparent electrode TE1. The current suppressing parts CS1b, CS2b, and CS3b are a region into which oxygen ion was implanted. The current suppressing parts CS1b, CS2b, and CS3b can be formed by irradiating the transparent electrode TE1 with oxygen plasma.

6-3. Shape of Current Suppressing Part

The current suppressing parts CS1, CS2, and CS3 may not necessarily have a square cylindrical shape. The current suppressing parts CS1, CS2, and CS3 may have, for example, a polygonal cylindrical shape or a cylindrical shape. The current suppressing parts CS1, CS2, and CS3 may have a lattice shape.

Figure 16:
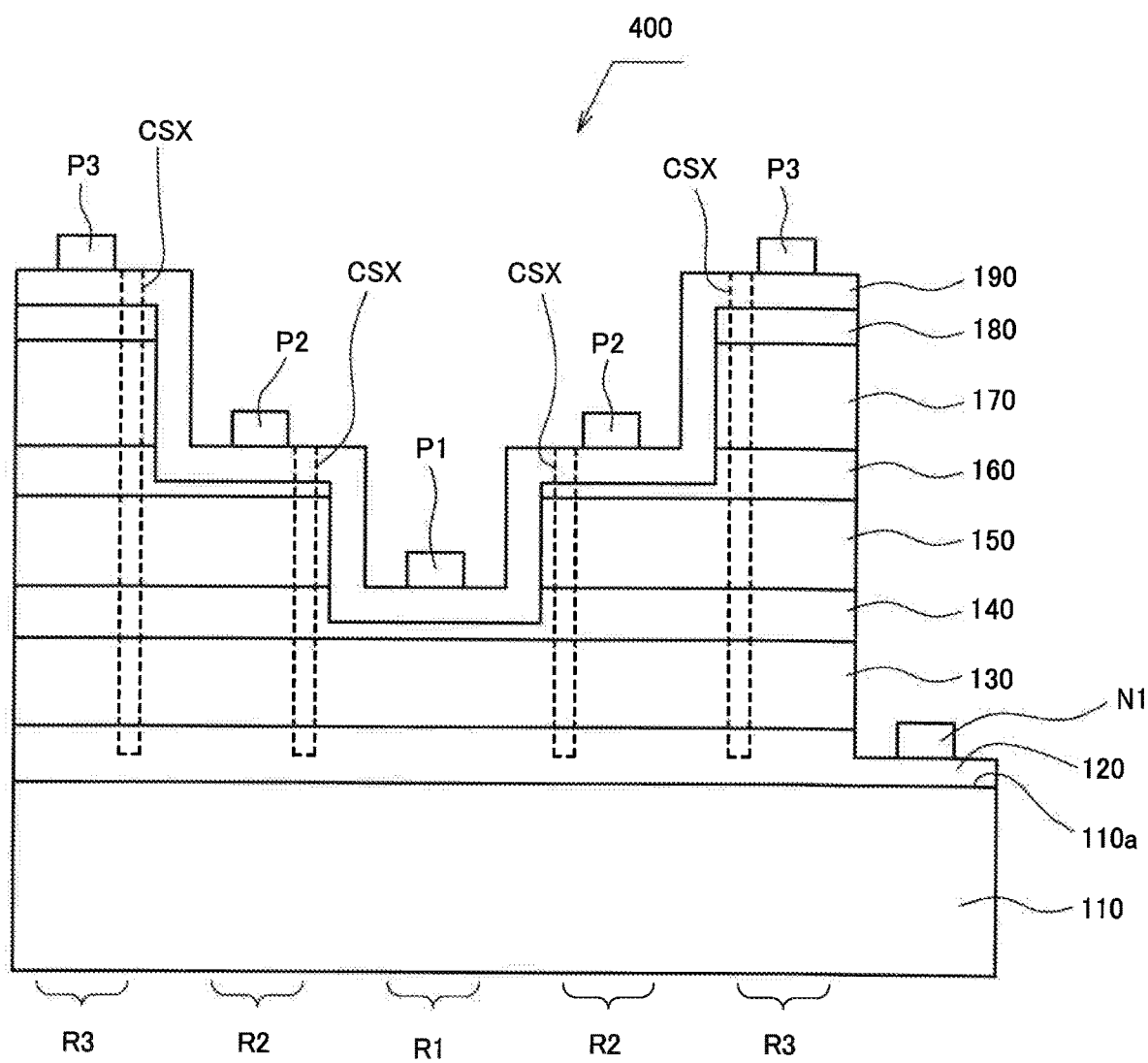
FIG. 16 is a schematic view of the structure of a light-emitting device 400 according to a variation of the second embodiment.

FIG. 16 is a schematic view of the structure of a light-emitting device 400 according to a variation of the second embodiment. The light-emitting device 400 includes a current suppressing part CSX. The current suppressing part CSX surrounds the first light-emitting layer 130, the second light-emitting layer 150, and the third light-emitting layer 170 in a lattice shape. Even in this case, the same effect is obtained as the effect of the second embodiment.

6-4. Ion Implantation

Ion other than oxygen ion may be implanted into a region where the current suppressing parts CS1, CS2, and CS3 are formed. For example, Zn may be implanted. By using Zn plasma, Zn ion may be implanted into a region where the current suppressing parts CS1, CS2, and CS3 are formed. At this time, the current suppressing parts CS1, CS2, and CS3 are made of Group III nitride containing Zn.

6-5. Composition

The barrier layer of the first light-emitting layer 130, the second light-emitting layer 150, and the third light-emitting layer 170 may be an AlInGaN layer other than a GaN layer.

6-6. Number of Light-Emitting Regions

In the second embodiment, the light-emitting device 100 includes the first light-emitting region R1, the second light-emitting region R2, and the third light-emitting region R3. However, the light-emitting device may have only the first light-emitting region R1. The light-emitting device includes the first light-emitting region R1 and the second light-emitting region R2, and may not include the third light-emitting region R3.

6-7. Buffer Layer

A buffer layer may be formed between the first surface 110a of the substrate 110 and the n-type contact layer 120.

6-8. Combinations

The aforementioned variations may be combined with one another without any restriction.

Third Embodiment

The third embodiment is described.

1. Light-Emitting Device

The fundamental structure of the light-emitting device 500 according to a third embodiment has the same fundamental structure of the light-emitting device 400 according to a variation of the second embodiment. In the light-emitting device 500 according to the third embodiment, the current suppressing part CS as a shielding wall plays a role as the absorbing structure absorbing light.

2. Light Absorption

In the light-emitting device 400 according to a variation of the second embodiment, the current suppressing part CSX is a region where ion is implanted into Group III nitride semiconductor. The region where oxygen ion was implanted into Group III nitride semiconductor has a high electric resistivity and absorbs light.

Figure 17:
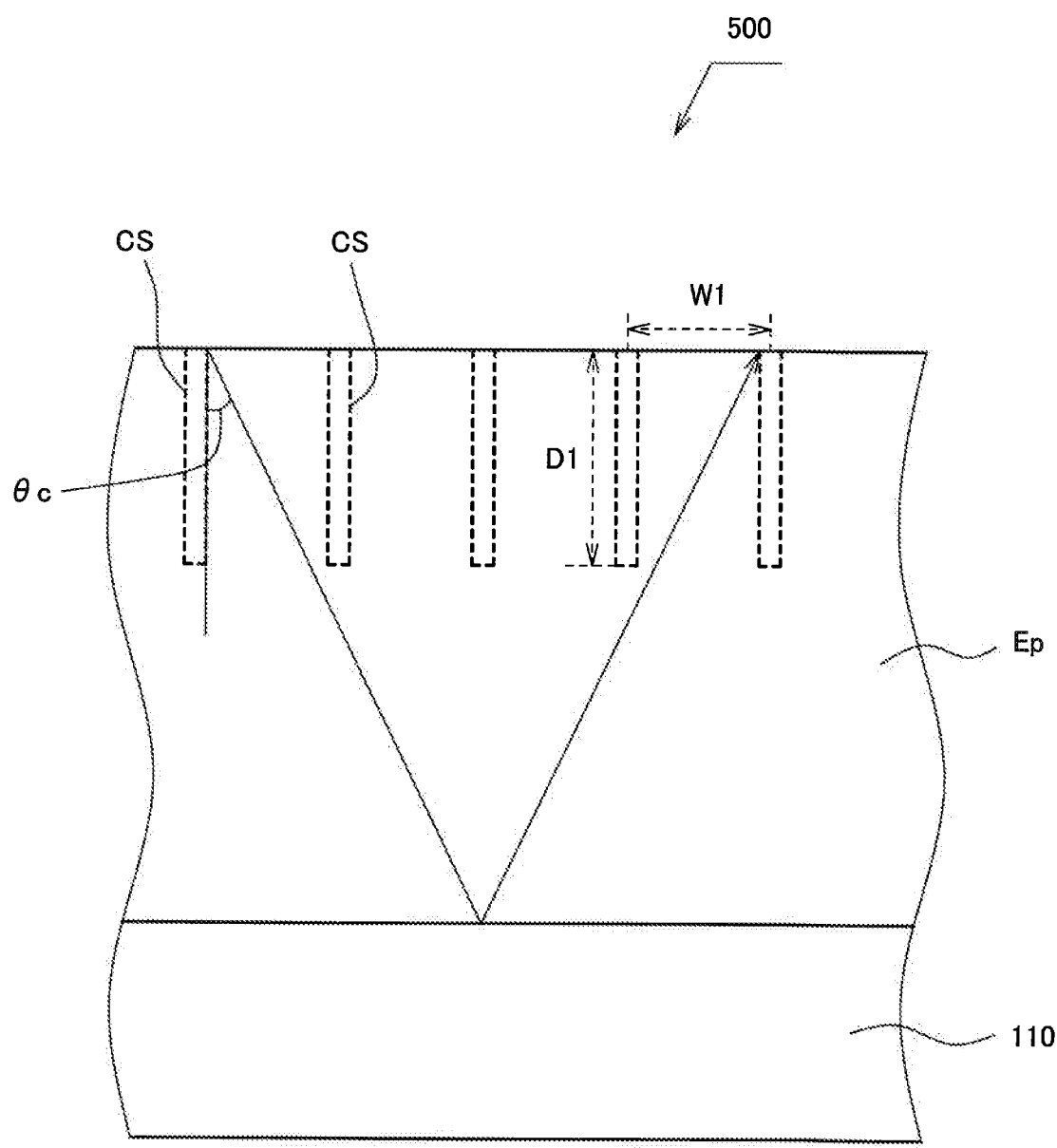
FIG. 17 is a view explaining light absorption in a light-emitting device 500 according to a third embodiment.

FIG. 17 is a view explaining light absorption in a light-emitting device 500 according to a third embodiment. In FIG. 17, the light-emitting device 500 includes a substrate 110, a semiconductor layer Ep, and a current suppressing part, i.e., optical shielding wall CS.

When the following equation is satisfied, the current suppressing part CS sufficiently absorbs light.

$$\tan(\theta c) \geq W1/D1$$

$$n1 \cdot \sin(\theta c) = n2$$

θc: Critical angle
W1: Pitch of subpixel
D1: Depth of shielding wall
n1: Refractive index of semiconductor
n2: Refractive index of substrate Therefore, the depth of the current suppressing part CS may satisfy the following equation.

$$D1 \geq W1/\tan(\theta c)$$

3. Effect of Third Embodiment

In the third embodiment, the current suppressing part CS absorbs light reflected at an interface with the substrate 110 before being incident on the adjacent sub pixels. Therefore, light emitted from the light-emitting layer of one sub pixel is suppressed from being absorbed by the light-emitting layers of other sub pixels. Thereby, light is suppressed from being reemitted from the light-emitting layers of other subpixels. Thus, the light-emitting device 500 has good contrast.

4. Variations

Zn plasma, nitrogen plasma may be used instead of oxygen plasma.

Variation of First Embodiment

Figure 18:
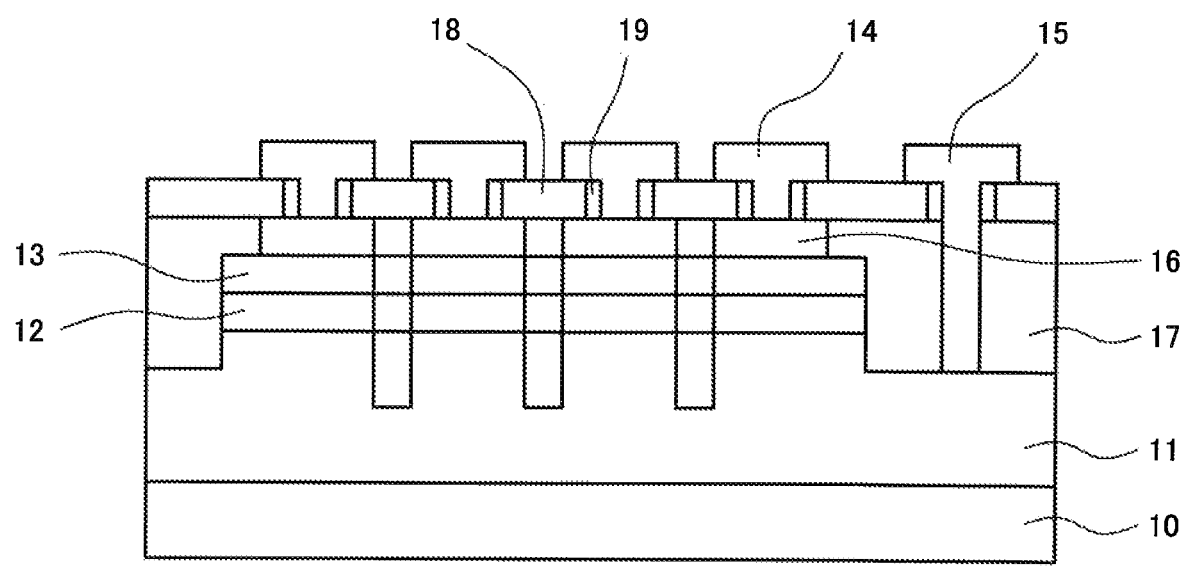
FIG. 18 shows the structure of a light-emitting device according to a variation of the first embodiment.

In this variation, as shown in FIG. 18 a shielding wall CS4 is formed. The structure of FIG. 18 is one that the current suppressing part or the optical shielding wall shown in FIG. 5 is applied in the structure shown in FIG. 1.

Combinations of Embodiments

The first to third embodiments may be combined including variations.

The present invention can be employed in a micro LED display.

What is claimed is:

1. A flip-chip mounted monolithic micro LED display element including a plurality of light-emitting parts arranged in a matrix, the micro LED display element comprising:
   a substrate;
   an n-type layer disposed on or above the substrate;
   a light-emitting layer disposed on or above the n-type layer;
   a p-type layer disposed on or above the light-emitting layer;
   a plurality of first electrodes formed for each light-emitting part on or above the p-type layer; and
   an absorbing structure absorbing light disposed on or above at least one of the plurality of first electrodes,
   wherein the absorbing structure includes a structure in which a dielectric film and a metal film are alternately deposited, and a top layer is a dielectric film.

2. The micro LED display element according to claim 1, wherein a through hole is formed in a region at an upper portion of the at least one of the plurality of first electrodes, the micro LED display further comprising:
   a second electrode formed in contact with the at least one of the plurality of first electrodes via the through hole at an upper portion of the absorbing structure; and
   a side wall insulating film formed on a side wall of the absorbing structure exposed by the through hole.

3. The micro LED display element according to claim 1, wherein the dielectric film is at least one selected from a group consisting of $TiO_2$ and $Nb_2O_5$.

4. The micro LED display element according to claim 1, wherein the dielectric film as a top layer of the absorbing structure is made of $SiO_2$, and other layers of the dielectric film are made of at least one selected from a group consisting of $TiO_2$ and $Nb_2O_5$.

5. The micro LED display element according to claim 1, wherein an insulating film made of $SiO_2$ is formed on the absorbing structure.

6. The micro LED display element according to claim 1, wherein the metal film of the absorbing structure is at least one selected from a group consisting of W, Mo, V, Ta, Cr, Ti, and Ni.

7. The micro LED display element according to claim 6, wherein a number of layers of the metal film of the absorbing structure is 2 to 5.

8. The micro LED display element according to claim 1, wherein a thickness of the dielectric film and the metal film of the absorbing structure is set to obtain incident angle dependency of reflectance of the absorbing structure such that a maximum reflectance is not more than 20% in a range where the incident angle is not more than 70° to the light with an emission wavelength of the light-emitting layer.

9. The micro LED display element according to claim 1, wherein a thickness of the dielectric film and the metal film of the absorbing structure is set so that a maximum reflectance is not more than 5% in a range where an incident angle to the light with an emission wavelength of the light-emitting layer is not more than 50°.

10. The micro LED display element according to claim 1, wherein a thickness of the dielectric film and the metal film of the absorbing structure is set so that a maximum reflectance is not more than 10% in a range of wavelength from 400 nm to 700 nm to the light with an incident angle of 0°.

11. The micro LED display element according to claim 1, wherein a shielding wall electrically and optically separate adjacent light-emitting parts is formed, and the shielding wall extends from a bottom of the absorbing structure to the n-type layer.

12. The micro LED display element according to claim 1, wherein the light-emitting layer is formed by depositing sub light-emitting layers emitting light with different wavelengths, and
   at least one of the sub light-emitting layers includes a step so that a band gap of the sub light-emitting layer becomes smaller in order from the substrate toward the p-type layer, and the at least one of the sub light-emitting layers does not exist between the sub light-emitting layers emitting light of emission color of each light-emitting part and the p-type layer.

13. The micro LED display element according to claim 1, wherein the light-emitting layer is formed by depositing sub light-emitting layers emitting light with different wavelengths,
   at least one of the sub light-emitting layers includes a step so that a band gap of the at least one of the sub light-emitting layers becomes smaller in order from the substrate toward the p-type layer, and the at least one of sub light-emitting layers does not exist between the sub light-emitting layers emitting light of emission color of each light-emitting part and the p-type layer, and
   a shielding wall is formed to electrically and optically separate adjacent light-emitting parts, the shielding wall extending so as to cover at least a total thickness from a bottom of the absorbing structure to the sub light-emitting layer emitting light of emission color of each light-emitting part.

14. A flip-chip mounted monolithic micro LED display element including a plurality of light-emitting parts arranged in a matrix, the micro LED display element comprising:
   a substrate;
   an n-type layer disposed on or above the substrate;
   a light-emitting layer disposed on or above the n-type layer; and
   a p-type layer disposed on or above the light-emitting layer, wherein the light-emitting layer is formed by depositing sub light-emitting layers emitting light with different wavelengths, at least one of the sub light-emitting layers includes a step so that a band gap of the at least one of the sub light-emitting layers becomes smaller in order from the substrate toward the p-type layer, and the at least one of the sub light-emitting layers does not exist between the sub light-emitting layers emitting light of emission color of each light-emitting part and the p-type layer, and a shielding wall electrically and optically separate adjacent light-emitting parts is formed, and the shielding wall extends from a bottom of an absorbing structure to the n-type layer.

15. The micro LED display element according to claim 14, wherein an intermediate layer is formed between the sub light-emitting layers, a band gap of the intermediate layer being larger than the band gap of the sub light-emitting layer of each light-emitting part.

16. The micro LED display element according to claim 14, wherein the shielding wall is a modified layer of semiconductor including high electric resistance by ion implantation and having high absorptivity of light emitted from the sub light-emitting layer.

17. The micro LED display element according to claim 16, wherein the modified layer is formed either so as to surround a periphery of each light-emitting part or in an entire region other than the light-emitting parts and the modified layer.

18. The micro LED display element according to claim 17, wherein a transparent electrode is formed on the p-type layer, and the modified layer is formed in the transparent electrode.

19. The micro LED display element according to claim 14, wherein a depth of the shielding wall satisfies following equations:

$$D1 \geq W1/\tan(\theta c)$$

$$n1 \cdot \sin(\theta c) = n2$$

θc: Critical angle,
W1: Pitch of subpixel,
D1: Depth of shielding wall,
n1: Refractive index of semiconductor,
n2: Refractive index of substrate.

* * * * *